(12) United States Patent
Kim et al.

(10) Patent No.: US 8,537,617 B2
(45) Date of Patent: Sep. 17, 2013

(54) SOURCE SIDE ASYMMETRICAL PRECHARGE PROGRAMMING SCHEME

(75) Inventors: Jin-Ki Kim, Ottawa (CA); Hong Beom Pyeon, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 13/365,913

(22) Filed: Feb. 3, 2012

(65) Prior Publication Data

US 2012/0262986 A1 Oct. 18, 2012

Related U.S. Application Data

(60) Continuation of application No. 13/091,479, filed on Apr. 21, 2011, now Pat. No. 8,139,414, which is a division of application No. 12/026,825, filed on Feb. 6, 2008, now Pat. No. 7,952,929.

(60) Provisional application No. 60/888,638, filed on Feb. 7, 2007.

(51) Int. Cl.
*G11C 11/34* (2006.01)

(52) U.S. Cl.
USPC ............ 365/185.12; 365/185.17; 365/185.18; 365/185.29; 365/185.33

(58) Field of Classification Search
USPC ............. 365/185.12, 185.17, 185.18, 185.23, 365/185.24, 185.25, 185.29, 185.33
See application file for complete search history.

(56) References Cited

U.S. PATENT DOCUMENTS

| 5,473,563 A | 12/1995 | Suh et al. |
| 5,546,341 A | 8/1996 | Suh et al. |
| 5,606,527 A | 2/1997 | Kwack |
| 5,715,194 A | 2/1998 | Hu |

(Continued)

FOREIGN PATENT DOCUMENTS

| JP | 10302488 | 10/1998 |
| JP | 11219595 | 8/1999 |

(Continued)

OTHER PUBLICATIONS

M. Momodomi, T. Tanaka, Y. Iwata, Y. Tanaka, H. Oodaira, Y. Itoh, R. Shirota, K. Ohuchi and F. Masuoka, "A 4-Mbit NAND EEPROM with tight programmed Vt distribution," IEEE J Solid-State Circuits, vol. 26, No. 4, Apr. 1991, pp. 492-496.

Tomoharu Tanaka, et al., "A Quick Intelligent Page-Programming Architecture and a Shielded Bitline Sensing Method for 3 V-Only NAND Flash Memory," IEEE J Solid- State Circuits, vol. 29, No. 11, Nov. 1994, pp. 1366-1373.

(Continued)

*Primary Examiner* — Trong Phan
(74) *Attorney, Agent, or Firm* — Shin Hung; Borden Ladner Gervais LLP

(57) ABSTRACT

A method for programming a NAND flash string. In the present method, wordlines are driven to a first pass voltage for coupling a string precharge voltage provided by a source line to the memory cells, where the string precharge voltage is greater than the first pass voltage. With the exception a first wordline corresponding to a first memory cell adjacent to a selected memory cell, all the other wordlines are driven to a second pass voltage greater than the first pass voltage. The first memory cell is positioned between the selected memory cell and a string select device. A second wordline corresponding to a second memory cell adjacent to the selected memory cell is driven to a first supply voltage for turning off the second memory cell. A third wordline corresponding to the selected memory cell is driven to a programming voltage greater than the second pass voltage. A bitline is then coupled to the selected memory cell.

9 Claims, 21 Drawing Sheets

(56) References Cited

U.S. PATENT DOCUMENTS

| | | | |
|---|---|---|---|
| 5,729,683 | A | 3/1998 | Le |
| 6,230,233 | B1 | 5/2001 | Lofgren |
| 6,453,365 | B1 | 9/2002 | Habot |
| 6,456,528 | B1 | 9/2002 | Chen |
| 6,594,183 | B1 | 7/2003 | Lofgren |
| 6,717,847 | B2 | 4/2004 | Chen |
| 6,807,106 | B2 | 10/2004 | Gonzales |
| 7,006,379 | B2 | 2/2006 | Noguchi |
| 7,180,787 | B2 | 2/2007 | Hosono |
| 7,212,439 | B2 | 5/2007 | Park |
| 7,394,695 | B2 | 7/2008 | Takeuchi |
| 7,420,843 | B2 | 9/2008 | Hosono |
| 7,457,156 | B2 | 11/2008 | Nazarian |
| 7,492,643 | B2 | 2/2009 | Takeuchi |
| 7,561,464 | B2 | 7/2009 | Toda |
| 7,561,472 | B2 | 7/2009 | Doyle |
| 7,688,641 | B2 | 3/2010 | Noh |
| 7,733,702 | B2 | 6/2010 | Hosono |
| 7,751,245 | B2 | 7/2010 | Sarin |
| 7,760,550 | B2 | 7/2010 | Fayrushin |
| 7,782,674 | B2 | 8/2010 | Roohparvar |
| 8,023,321 | B2 | 9/2011 | Kim |
| 2002/0161941 | A1 | 10/2002 | Chue et al. |
| 2005/0180213 | A1 | 8/2005 | Abe et al. |
| 2005/0226055 | A1 | 10/2005 | Guterman |
| 2005/0232012 | A1 | 10/2005 | Park |
| 2006/0002167 | A1 | 1/2006 | Rudeck et al. |
| 2006/0227613 | A1 | 10/2006 | Joo |
| 2006/0245252 | A1 | 11/2006 | Han et al. |

FOREIGN PATENT DOCUMENTS

| | | |
|---|---|---|
| JP | 11265589 | 9/1999 |
| JP | 2001332093 | 11/2001 |
| JP | 2002117687 | 4/2002 |
| JP | 2003151289 | 5/2003 |
| JP | 2005310347 | 11/2005 |
| JP | 2006522428 | 9/2006 |

OTHER PUBLICATIONS

Kang-Deog Suh et al., "A 3.3 V 32 Mb NAND Flash Memory with Incremental Step Pulse Programming Scheme," IEEE J Solid-State Circuits, vol. 30, No. 11, Nov. 1995, pp. 1149-1156.

Tae-Sung Jung et al., "A 117-mm2 3.3-V Only 128-Mb Multilevel NAND Flash Memory for Mass Storage Applications" IEEE J Solid-State Circuits, vol. 31, No. 11, Nov. 1996, pp. 1575-1583.

Jin-Ki Kim et al., "A 120-mm2 64-Mb NAND Flash Memory Achieving 180 ns/Byte Effective Program Speed," IEEE J Solid-State Circuits, vol. 32, No. 5, Apr. 1997, pp. 670-680.

Ken Takeuchi et al., "A Source-Line Programming Scheme for Low-Voltage Operation NAND Flash Memories", IEEE J Solid-State Circuits, vol. 35, No. 5, May 2000, pp. 672-681.

June Lee et al., "High-Performance 1-Gb NAND Flash Memory With 0.12um Technology," IEEE J Solid-State Circuits, vol. 37, No. 11, Nov. 2002, pp. 1502-1509.

June Lee et al., "A 90-nm CMOS 1.8-V 2-Gb NAND Flash Memory for Mass Storage Applications," IEEE J Solid-State Circuits, vol. 38, No. 11, Nov. 2003, pp. 1934-1942.

International Application No. PCT/CA2008/000182, Search Report dated May 15, 2008, p. 2.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Saito, et al., "A Programmable 80ns 1Mb CMOS EPROM", IEEE ISSCC Digest of Technical Papers, Feb. 14, 1985, pp. 176-177, 340.

Ohtsuka, N. et al., "A 4-Mbit CMOS EPROM", IEEE Journal of Solid-State Circuits, vol. 22, Issue 5, Oct. 1987, pp. 669-675.

Takeuchi, K. et al., "A multipage cell architecture for high-speed programming multilevelNAND flash memories", IEEE Journal of Solid-State Circuits, vol. 33, Issue 8, Aug. 1998, pp. 1228-1238.

Tanzawa, et al., "A dynamic analysis of the Dickson charge pump circuit;" IEEE J. Solid-State Circuits, vol. 32, No. 8, pp. 1231-1240, Aug. 1997.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Tomita, N. et al., "A 62-ns 16Mb CMOS EPROMm with Voltage Stress Relaxation Technique" IEEE Journal of Solid-State Circuits vol. 26, No. 11, Nov. 1991, pp. 1593-1599.

Cho, T. et al., "A Dual Mode NANSD Flash Memory: 1-Gb Multi-level and High-Performance 512-Mb Single-Level Modes", IEEE Journal of Solid-State Circuits, vol. 36, No. 11, Nov. 2001, pp. 1700-1706.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US, pp. 129-130.

Aritome, S. et al., "A Reliable Bi-Polarity Write/Erase Technology in Flash EEPROMS", Int'l. Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, Dec. 1990, pp. 103-106.

Hara, T. et al., "A 146-mm2 8-Gb Multi-Level NAND Flash Memory With 70-nm CMOS Technology", IEEE Journal of Solid State Circuits, Jan. 2006, vol. 41, No. 1, pp. 161-169.

Lee, S. et al., "A 3.3V 4Gb Four-Level NAND Flash Memory with 90nm CMOS Technology", ISSCC 2004/Session 2 Non-Volatile Memory/2.7, IEEE International Solid-State Circuits Conference, Feb. 15-19, 2004,Digest of Technical Papers, vol. 1, XP010722148, ISBN: 0-7803-8267-6, 10 pages.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Feb. 6-9, 2006, ISBN: 1-4244-0079-1.

Samsung Electronics Co. Ltd, "256M×8 Bit / 128 M×16 Bit / 512M×8 Bit NAND Flash Memory", K9K4GO8U1M, May 6, 2005, pp. 1-41.

Samsung Electronics Co. Ltd, "1G×8 Bit / 1G×8 Bit NAND Flash Memory", K9F8GO8UXM, May 31, 2007, pp. 1-54.

Samsung Electronics Co. Ltd, "512M×8 Bit / 1G×8 Bit NAND Flash Memory", K9XXGO8UXA, May 7, 2006, pp. 1-43.

Samsung Electronics Co. Ltd, "1G×8 Bit / 2G×8 Bit / 4G×8 Bit NAND Flash Memory", K9XXG08UXA, Jul. 18, 2006, pp. 1-50.

Choi, Young, "16-Gbit MLC NAND Flash Weighs in", EETimes. com, Jul. 7, 2007, pp. 1-3, http://www.eetimes.com/showArticle.jhtml?articleID=201200825.

Gal, et al., "Algorithms and data structures for flash memories", ACM Computing Surveys (CSUR), vol. 37, No. 2, p. 138-163, Jun. 2005, Tel Aviv University.

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Samsung Electronics Co. Ltd, "2G×8 Bit NAND Flash Memory", K9GAGO8UOM, Apr. 12, 2006, pp. 1-48.

Toshiba, "16 GBIT (2G×8 Bit) CMOS NAND E2PROM (Multi-Level-Cell)", TC58NVG4D1DTGOO, Nov. 9, 2006.

Toshiba, "2GBIT (256M×8 Bits) CMOS NAND E2PROM", TH58NVG1S3AFT05, May 19, 2003.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Ken Takeuchi et al., A Source-Line Programming Scheme for Low-Voltage Operation NAND Flash Memories, vol. 35, No. 5, pp. 672-681, May 2000.

US 8,537,617 B2

SOURCE SIDE ASYMMETRICAL PRECHARGE PROGRAMMING SCHEME

CROSS REFERENCE TO RELATED APPLICATIONS

This application is continuation of U.S. application Ser. No. 13/091,479, filed on Apr. 21, 2011, which is a divisional application of U.S. patent application Ser. No. 12/026,825, filed Feb. 6, 2008, now U.S. Pat. No. 7,952,929, issued on May 31, 2011 which claims the benefit of priority of U.S. Provisional Patent Application Ser. No. 60/888,638 filed on Feb. 7, 2007, which is incorporated herein by reference in its entirety.

TECHNICAL FIELD

The present invention relates generally to semiconductor devices. More particularly, the present invention relates to flash memory devices and a method of flash device programming.

BACKGROUND

Numerous types of consumer electronics products rely on some form of mass storage for retaining data or software for the execution of code by a microcontroller. Such consumer electronics are prolific, and include devices such as personal digital assistants (PDA's), portable music players, portable multimedia players (PMP's) and digital cameras. In PDA's, mass storage is required for storing applications and data, while portable music players and digital cameras require large amounts of mass storage for retaining music file data and/or image data. The mass storage solution for such portable electronics is preferably small in size, consumes minimal power, and has high storage density. This limits the selection to non-volatile forms of memory since volatile memories, such as static random access memory (SRAM) and dynamic random access memory (DRAM), require a constant application of power in order to retain data. As is known in the art, portable electronics rely on batteries that have a finite power supply. Therefore, non-volatile memories that retain data after power is removed are preferred.

While many consumer products use commodity flash memory, flash memory is indirectly used by consumers in products such as cell phones and devices with microprocessing functions. More specifically, the application specific integrated circuits (ASIC) commonly found in consumer electronics can have integrated flash memory to enable firmware upgrades. Needless to say, flash memory is versatile due to its optimal balance in size, storage density, and speed, making it a preferred non-volatile mass storage solution for consumer electronics.

It is well known to those skilled in the art that flash memory devices are subject to program disturb. More specifically, when a selected memory cell is to be programmed by driving a corresponding selected wordline to a programming voltage, unselected memory cells along the same wordline that are not be programmed can be inadvertently soft programmed. This is due to a problem where the biasing for establishing a program inhibit state for selected memory cells not to be programmed is insufficient for fully preventing these memory cells from being programmed. Furthermore, unselected memory cells in the flash memory are also subjected to program disturb because the applied voltages to the unselected wordlines during the programming operation are too high, which can result in a shifting of programmed or erased threshold voltages. This problem has been addressed with sequential programming schemes, however the prohibition of random page program operations results in performance degradation in applications because operational flexibility associated with random page programming is lost.

SUMMARY

According to a first aspect of the present invention, there is provided a method for programming a NAND flash string having a source line select device, memory cells and a string select device connected in series between a bitline and a source line. The method includes biasing the bitline, asymmetrically precharging groupings of channels, and programming the selected memory cell. The bitline is biased to one of a first supply voltage level and a second supply voltage level. The groupings of channels correspond to the memory cells, which are asymmetrically precharged to different voltage levels from the source line for setting a selected memory cell channel to a program inhibit state independent of background data stored in unselected memory cells. The selected memory cell is programmed only when the bitline is biased to the second supply voltage level, and the selected memory cell remains in the program inhibit state when the bitline is biased to the first supply voltage level. According to an embodiment of the present aspect, programming the selected memory cell includes driving the string select device to the first supply voltage level for coupling the bitline to the selected memory cell only when the bitline is biased to the second supply voltage level. Asymmetrically precharging can include biasing the source line to a string precharge voltage and coupling the source line to the memory cells by driving the source line select device to a source line pass voltage.

According to an aspect of the method, asymmetrically precharging includes precharging a lower channel, precharging an intermediate channel and precharging an upper channel. The lower channel corresponds to the memory cells between the source line select device and a first memory cell adjacent to the selected memory cell, which is precharged to a first precharge voltage, and the lower channel includes the selected memory cell and a second memory cell adjacent to the selected memory cell. The intermediate channel corresponds to the first memory cell, which is precharged to a second precharge voltage. The upper channel corresponds to the memory cells between the first memory cell and the string select device, which is precharged to a third precharge voltage. Precharging the lower channel includes driving the gate terminals of the memory cells between the source line select device and the first memory cell to a first pass voltage. Precharging the intermediate channel includes driving the gate terminal of the first memory cell to a second pass voltage, the second pass voltage being at least 0V, where the second pass voltage is greater than a programmed memory cell threshold voltage and less than the pass voltage. Precharging the upper channel includes driving the gate terminals of the memory cells between the first memory cell and the string select device to the first pass voltage. Later, the upper channel is boosted by a difference between the first pass voltage and the second pass voltage to provide the third precharge voltage, where the second pass voltage is selected to be a value for turning off the first memory cell when the upper channel is at the third precharge voltage.

According to another aspect of the method, precharging the lower channel further includes turning off the second memory cell, and turning off the source line select device. Precharging the lower channel further includes locally boosting the selected memory cell channel to a voltage effective for inhibiting programming by driving the gate of the selected memory cell to a programming voltage. The programming voltage is greater than the first pass voltage, the string precharge voltage and the source line pass voltage, and the string precharge voltage is at least the source line pass voltage. In yet another embodiment of the present aspect, the string precharge voltage and the source line pass voltage are at the first pass voltage. At least one of the memory cells between the selected memory cell and the source line select device corresponds to a programmed page, the at least one of the memory cells having one of a programmed threshold voltage and an erased threshold voltage. The first memory cell can correspond to a programmed page having one of the programmed threshold voltage and the erased threshold voltage. The memory cells between the selected memory cell and the source line select device correspond to erased pages having an erased threshold voltage, or alternately, the memory cells between the selected memory cell and the string select device correspond to erased pages having an erased threshold voltage.

In a second aspect of the present invention, there is provided a method for programming a NAND flash string having a source line select device, memory cells and a string select device connected in series between a bitline and a source line. The method includes biasing the bitline to one of a first supply voltage level and a second supply voltage level; precharging groupings of channels corresponding to the memory cells to different voltage levels from the source line for turning off a first memory cell adjacent to a selected memory cell; precharging the selected memory cell channel to a program inhibit state in response to an applied programming voltage; and, driving the string select device to the first supply voltage level for coupling the bitline to the selected memory cell only when the bitline is biased to the second supply voltage level, the selected memory cell remaining in the program inhibit state when the bitline is biased to the first supply voltage level.

In a third aspect of the present invention, there is provided a method for programming a NAND flash string having a source line select device, memory cells and a string select device connected in series between a bitline and a source line. The method includes driving all wordlines to a first pass voltage, continuing driving all the wordlines except a first wordline to a second pass voltage, driving a second wordline to a first supply voltage, driving a third wordline to a programming voltage, and coupling the bitline to a selected memory cell. All the wordlines are driven to the first pass voltage for coupling a string precharge voltage provided by the source line to the memory cells, the string precharge voltage being greater than the first pass voltage. All the wordlines except a first wordline corresponding to a first memory cell adjacent to the a selected memory cell are driven to a second pass voltage greater than the first pass voltage, the first memory cell being positioned between the selected memory cell and the string select device. The second wordline corresponding to a second memory cell adjacent to the selected memory cell is driven to the first supply voltage for turning off the second memory cell. The third wordline corresponding to the selected memory cell is driven to the programming voltage which is greater than the second pass voltage.

In an embodiment of the present aspect, coupling the string precharge voltage includes driving the source line select device to a source line pass voltage, and coupling the bitline includes driving the string select device to the second supply voltage. In the present method, the programming voltage is greater than the second pass voltage, the string precharge voltage and the source line pass voltage, the string precharge voltage is at least the source line pass voltage, and the first pass voltage is at least 0V. The string precharge voltage and the source line pass voltage are at the first pass voltage, and the first pass voltage is greater than a programmed memory cell threshold voltage. In a further embodiment, the memory cells in advance of the selected memory cell in a sequential programming direction correspond to erased pages, where the sequential programming direction includes a first direction being from the selected memory cell to the source line, and a second direction being from the selected memory cell to the bitline. In this embodiment, the first pass voltage is set to 0V in the second programming direction.

In a fourth aspect of the present invention, there is provided a flash memory device. The flash memory device includes a driver and a controller. The driver drives a source line select device, memory cells and a string select device connected in series between a bitline and a source line. The controller controls the driver in a programming operation, and is configured to drive all wordlines of the memory cells to a first pass voltage for coupling a string precharge voltage provided by the source line to the memory cells, the string precharge voltage being greater than the first pass voltage; to continue driving all the wordlines except a first wordline corresponding to a first memory cell adjacent to the a selected memory cell to second pass voltage greater than the first pass voltage, the first memory cell being positioned between the selected memory cell and the string select device; to drive a second wordline corresponding to a second memory cell adjacent to the selected memory cell to a first supply voltage for turning off the second memory cell; to drive a third wordline corresponding to the selected memory cell to a programming voltage greater than the second pass voltage, and to couple the bitline to the selected memory cell.

In an embodiment of the present aspect, the driver includes wordline drivers, a block decoder and a row decoder. The wordline drivers couple row signals to the memory cells, a source select signal to the source line select device and a string select signal to a string select device. The block decoder enables the wordline drivers in response to a block address. The row decoder provides the row signals, the source select signal and the string select signal in response to a row address. In yet a further embodiment, the row decoder includes a row decoder circuit for providing one of the row signals, the row decoder circuit including a multiplexor for selectively coupling one of the programming voltage, the first pass voltage and the second pass voltage to the one of the row signals. The row decoder can include a row decoder circuit for providing the source select signal, the row decoder circuit including a multiplexor for selectively coupling one of VSS and the second pass voltage to the source select signal. The row decoder can provide the string select signal, the row decoder circuit including a multiplexor for selectively coupling one of VSS and VDD to the string select signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 2b is plan view layout of the two NAND memory cell strings shown in FIG. 2a;

DETAILED DESCRIPTION

Generally, the present invention provides a method for programming NAND flash memory to minimize program stress while allowing for random page programming operations. The NAND string is asymmetrically precharged from a positively biased source line, while the bitline is decoupled from the NAND string. Then a programming voltage is applied to the selected memory cell, and then followed by the application of bitline data. After asymmetrical precharging and application of the programming voltage, all the selected memory cells will be set to a program inhibit state as they will be decoupled from the other memory cells in their respective NAND strings, and their channels will be locally boosted to a voltage effective for inhibiting programming. A VSS biased bitline will discharge the locally boosted channel to VSS, thereby allowing programming of the selected memory cell to occur. A VDD biased bitline will have no effect on the pre-charged NAND string, thereby maintaining a program inhibited state of that selected memory cell. This NAND flash memory programming method will be referred to as a source side asymmetrical precharge programming scheme.

Figure 1:
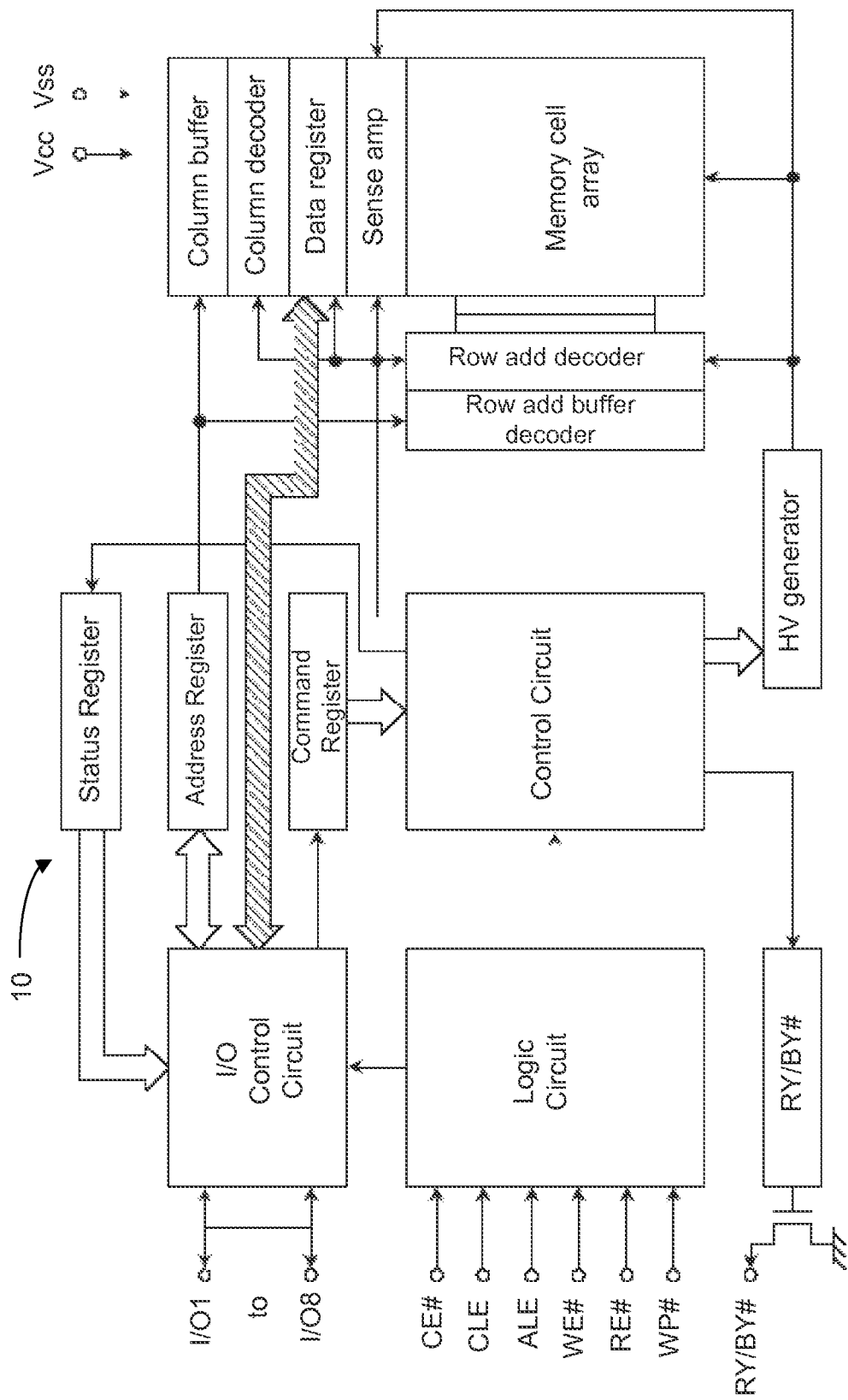
FIG. 1 is a block diagram of typical Flash memory.

FIG. 1 is a general block diagram of typical flash memory of the prior art. flash memory 10 includes logic circuitry for controlling various functions of the flash circuits, registers for storing address and data, high voltage circuits for generating the required program and erase voltages, and core memory circuits for accessing the flash memory array. The functions of the shown circuit blocks of Flash memory 10 should are well known in the art. Flash memory block 10 includes a number of pins or ports, for example, such as I/O1 to I/O8, CE#, CLE, ALE, WE#, RE#, WP#, RY/BY#, Vcc, and Vss. Persons skilled in the art will understand that Flash memory 10 shown in FIG. 1 represents one possible Flash memory configuration among many possible configurations.

Figure 2A:
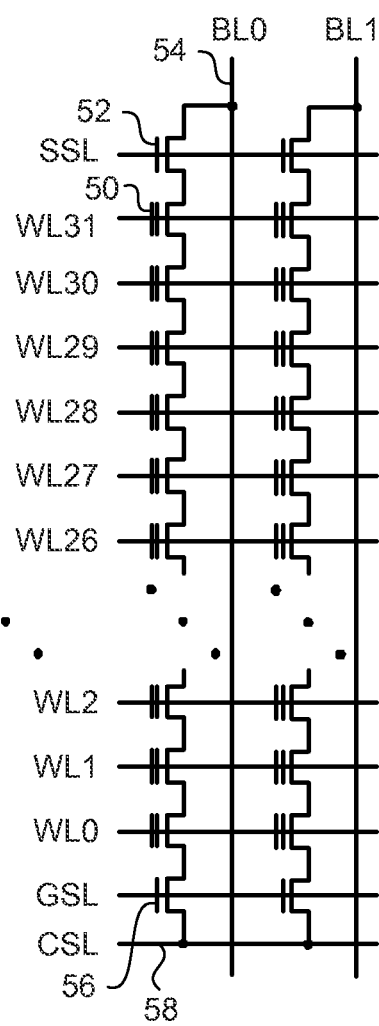
FIG. 2a is a circuit schematic of two NAND memory cell strings.
Figure 2B:
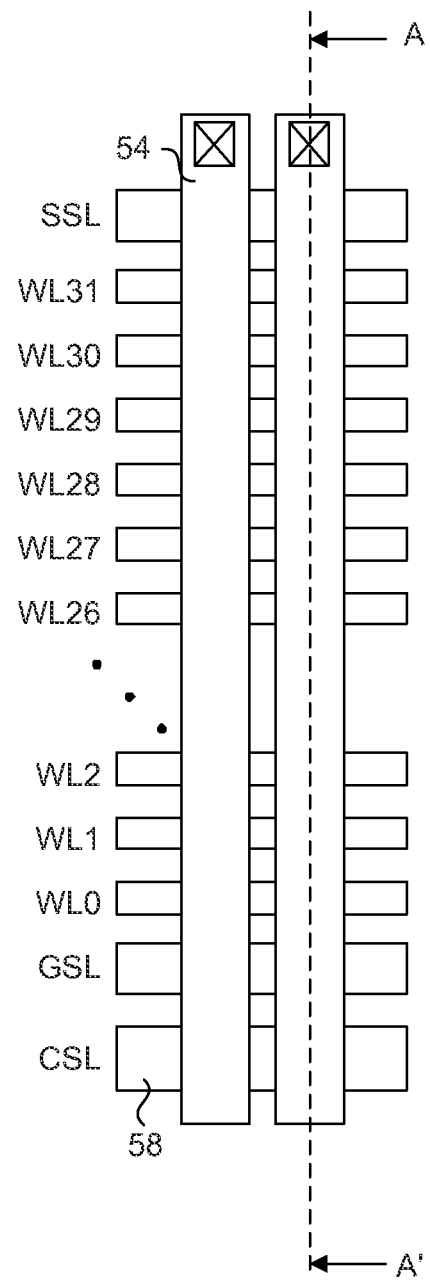
Figure 2C:
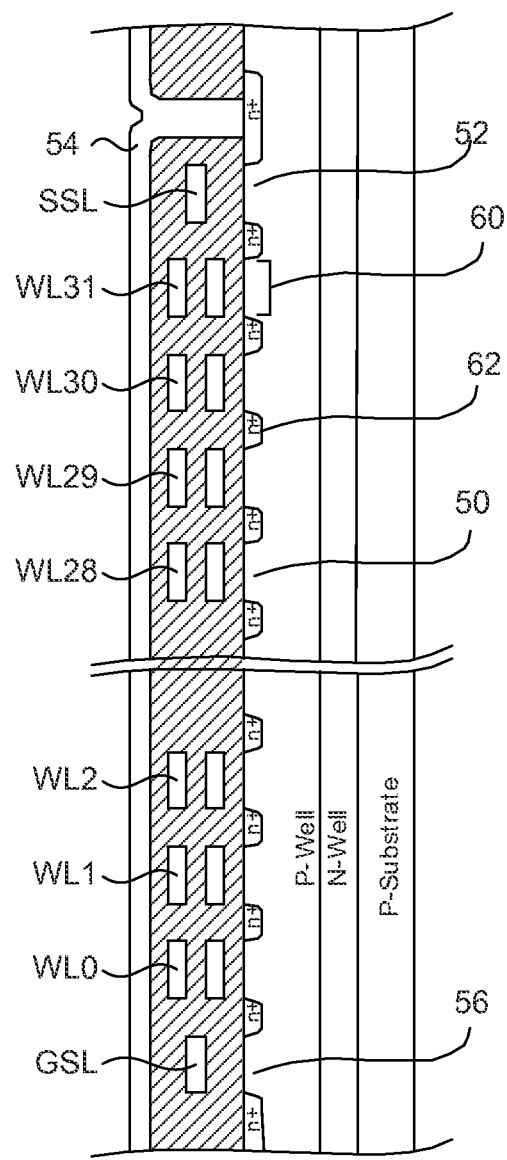
FIG. 2c is a cross-sectional view of one NAND memory cell string shown in FIG. 2b along line A-A'.

FIGS. 2a, 2b and 2c are illustrations of the NAND memory cell string used in the flash memory cell array shown in FIG. 1. FIG. 2a is a circuit schematic of two NAND memory cell strings, each connected to bitlines BL0 and BL1. FIG. 2b is a physical layout of the two NAND memory cell strings shown in FIG. 2a. FIG. 2c is a cross-sectional view of one NAND memory cell string shown in FIG. 2b along line A-A'. In the presently shown example, each NAND memory cell string includes 32 serially connected floating gate memory cells 50 each connected to respective wordlines WL0 to WL31, a string select transistor 52 connected between the bitline 54 and the first floating gate memory cell 50, and a ground select transistor 56 connected between a common source line (CSL) 58 and the last floating gate memory cell 50. The gate of string select transistor 52 receives a string select signal SSL, while the gate of ground select transistor 56 receives a ground select signal GSL. The NAND memory cell strings share common wordlines, string select SSL, and ground select GSL signal lines. Each memory cell 50, string select transistor 52 and ground select transistor 56 have channel regions 60 underneath the gate oxides between diffusion regions 62.

The construction and arrangement of the shown NAND memory string is well known in the art, which can include any number of memory cells per string. Generally, all the memory strings connected in parallel to the same wordline, SSL and GSL signals form a memory block, and all the memory cells connected in parallel to the same wordline form a memory page of the memory block.

Prior to any program operation, the NAND memory cell strings of the memory array are first erased, according to well-known techniques in the art. Each block of NAND memory cell strings can be selectively erased, therefore one or more blocks can be simultaneously erased. This means that all the pages of a memory block are simultaneously erased, however portions of a memory block can be selectively erased. When successfully erased, all erased floating gate memory cells 50 will have a negative threshold voltage. In effect, all erased memory cells 50 are set to a default logic state, such as a logic "1", for example. Programmed memory cells 50 will have their threshold voltages changed to a positive threshold voltage, thus representing the opposite "0" logic state.

Figure 3:
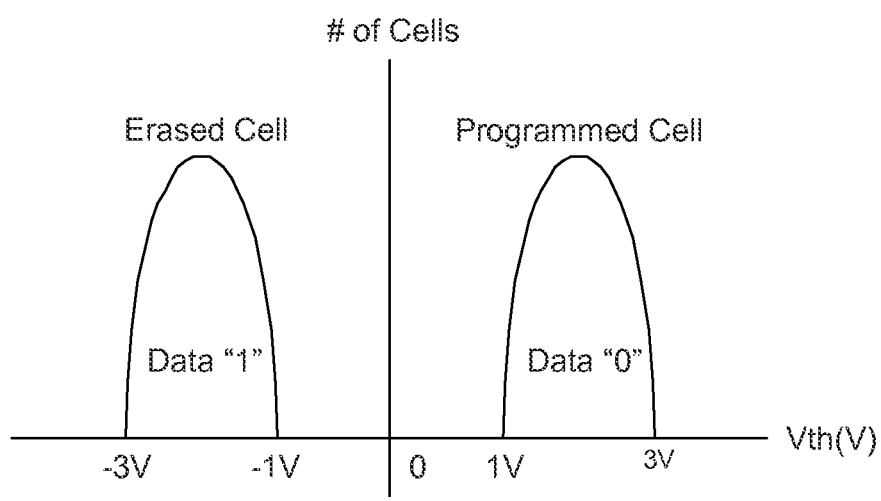
FIG. 3 is a threshold voltage (Vt) distribution graph for erased memory cells and programmed memory cells.

FIG. 3 shows a threshold voltage (Vt) distribution graph for erased memory cells and programmed memory cells. Due to process and voltage supply variations, the erased and programmed threshold voltages will be distributed within a voltage range. As shown in FIG. 3 for example, erased memory cells can have a negative threshold voltage between −3V to −1V, while programmed memory cells can have a positive threshold voltage between 1V and 3V. Generally, a cell is programmed by applying a high voltage to its gate while keeping its source and drain terminals grounded. The high electrical field causes electrons in the memory cell channel to cross the gate oxide and embed in the floating gate (known as Fowler-Nordheim (F-N) Tunneling), thereby increasing the effective threshold voltage of the memory cell.

Programming is typically done by the page, meaning that all the memory cells 50 in the block connected to the same wordline are selected to be programmed with write data (logic "0") at the same time. The remaining memory cells are thus unselected during programming. Since the memory cells start in the erased state (logic "1") prior to programming, only the memory cells to be programmed with the logic "0" should be subjected to the high electric fields necessary to promote F-N tunneling. Programming of a selected memory cell is affected by applying a programming voltage VPGM to the gate of the selected memory cell. However, due to the physical connections of the memory array, all the memory cells along the same wordline receive the same high voltage programming level. As a result, there is a potential that erased memory cells will have their threshold voltages unintentionally shifted. This is called program disturb, which is well known in the flash memory field. There are programming schemes known in the art for minimizing program disturb.

One well known programming scheme is described in the paper by June Lee et al. titled, "A 90-nm CMOS 1.8-V 2-Gb NAND Flash Memory for Mass Storage Applications," IEEE J Solid-State Circuits, vol. 38, no. 11, pp. 1934-1942, November 2003. In this sequential programming scheme, with reference to FIG. 2a for example, the string select transistors 52 are turned on and the ground select transistors 56 are turned off, while the bitline voltages for cells to be programmed are set to VSS, while the bitline voltages for cells to be program inhibited are set to VDD. A VSS biased bitline ties the channel of the corresponding NAND string to ground. When the program voltage (Vpgm) is applied to the gate of the selected memory cell, the large potential difference between gate and channel results in F-N tunneling of electrons onto the floating gate, thereby programming the cell. In memory cells to be program inhibited, the bitline initially precharges the NAND string channels. When the wordline voltages of the NAND string rise to the program voltage Vpgm for the selected wordline, and to the pass voltage (Vpass) for the unselected wordlines, the series capacitances through the control gate, floating gate, channel, and bulk are coupled and the channel potential is automatically boosted. As the coupled channel voltage rises to VDD−Vth_sst, where Vth_sst is the threshold voltage of the string select transistor 52, the string select transistors 52 shuts off and the channel becomes a floating node. It has been determined that the floating channel voltage rises to approximately 80% of the gate voltage. Thus, the channel voltages of program inhibited cells are boosted to approximately 8V when program Vpgm is between 15.5V to 20V, and the pass voltage Vpass is at 10V. This high channel voltage prevents F-N tunneling from occurring in the program inhibited cells.

Unfortunately, this type of programming scheme suffers from a strong dependency on VDD. More specifically, the boosted channel voltage level strongly depends on initial precharge level which is as a function of VDD. The maximum precharge level of the selected NAND string prior to channel boosting will be VDD−Vth_sst (Vth of SST) when all the cells in the selected NAND string are in the erased state. However, a lower VDD voltage is highly desirable in order to reduce power consumption. In NAND flash, the typical VDD operating voltage is between 2.7V to 3.6V, regardless of process nodes at the present time. Even NAND flash memory devices at the 50 nm process node use a VDD of 3.3V. The main reason to keep 3.3V is reducing program stress although 1.8V is strongly desirable.

Another problem with such schemes is SSL to adjacent wordline coupling which can negatively influence device performance. In the programming operation, after SSL is biased to VDD for coupling the bitline voltage to the NAND string, WL31 is increased from 0V to the pass voltage Vpass. Ideally, the boosted channel will rise to a level that will turn off the string select transistor 52. However, SSL is increased temporally by capacitive coupling with WL31, resulting in temporary activation of the string select transistor 52. It should be noted that the boosted channel capacitance (5 fF) is ten thousand times smaller than the bitline capacitance. Therefore, although the string select transistor 52 is operating in the sub-threshold regime, the channel may lose its boosted charge by charge sharing with the bitline. This will likely lead to the program inhibited cell being undesirably programmed by stress.

Figure 4:
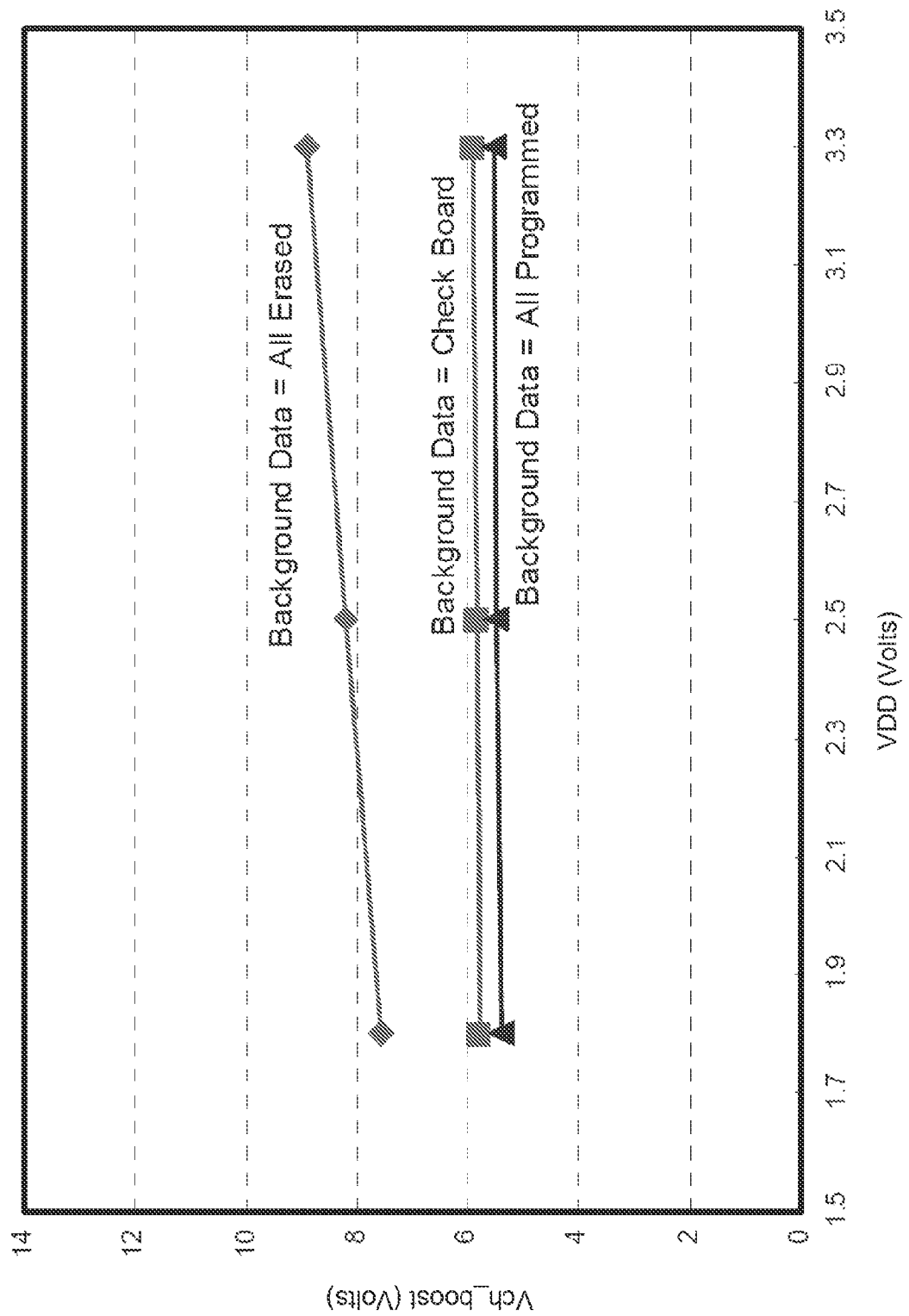
FIG. 4 is a simulation plot of boosted channel voltage versus VDD for different background data patterns for a prior art NAND flash programming scheme.

FIG. 4 is a simulation of the June Lee et al. sequential programming scheme showing the boosted channel voltage Vch_boost for the selected memory cell in relation to the supply voltage VDD. In this simulation, Vpgm=18V, Vpass=10V, the erased threshold voltage of a memory cell is Vthc_erase=−3V and the programmed threshold voltage of a memory cell is Vtch_pgm=2V. Vch_boost data is plotted for three different scenarios. In a first scenario, indicated in FIG. 4 as Background Data=All Erased, all the memory cells of the NAND string are erased. In a second scenario, indicated in FIG. 4 as Background Data=Check Board, the memory cells of the NAND string have a checkerboard data pattern. In a third scenario, indicated in FIG. 4 as Background Data=All Programmed, the unselected memory cells of the NAND string between the selected memory cell to be programmed and the bitline are programmed. The final boosted channel voltage (Vch_boost) should be at least 7V to avoid soft programming (i.e. Vpgm stress) at Vpgm of 18V. However Vch_boost is lower than 6V when the unselected cells in the NAND string are all programmed. Therefore Vpass should be increased to reduce Vpgm stress, but the increased Vpass introduces more Vpass stress. Hence the effectiveness of the program inhibit of such programming schemes is reduced due to the Background Data Pattern Dependency (BDPD). Furthermore, the simulation result shows that Vch_boost is dependent on VDD, and becomes less effective for inhibiting programming as VDD drops.

Therefore, as the process technology scales down, VDD should be decreased. In order to accommodate VDD scaling, random page programming is prohibited in the above described boosted channel programming scheme, and memory blocks are restricted to sequential programming in order to minimize program stress. In sequential programming, the NAND string is sequentially programmed from the bottom page coupled to WL0 (LSB page) to the top page (MSB page) coupled to WL31, where the upper cells of the selected cell are always erased so that unselected memory cells can fully transfer the initial precharging voltage from the bitline to the NAND string channel, and therefore result in a higher boosted program inhibit voltage. Persons skilled in the art will understand that random page program prohibition in a block will result in performance degradation in certain applications. Furthermore, sequential page programming does not eliminate BDPD, and can not reduce the Vpass voltage to minimize the program stress. There are three possible cases that can affect the final boosted channel precharge voltage.

In Case 1, page 0 corresponding to WL0 is to be programmed, while all upper memory cells are in the erased state. The final boosted channel voltage will be about 9.6V, which is the best case scenario. In case 2, page 15 corresponding to WL15 is to be programmed, while all lower memory cells are programmed and all upper memory cells are erased. The final boosted channel voltage will be less than 9.6V, but greater than the following worst case scenario. In the worst case scenario of case 3, page 31 corresponding to WL31 is to be programmed, while all the lower cells are programmed. The final boosted channel voltage will be about 6.5V.

Figure 5:
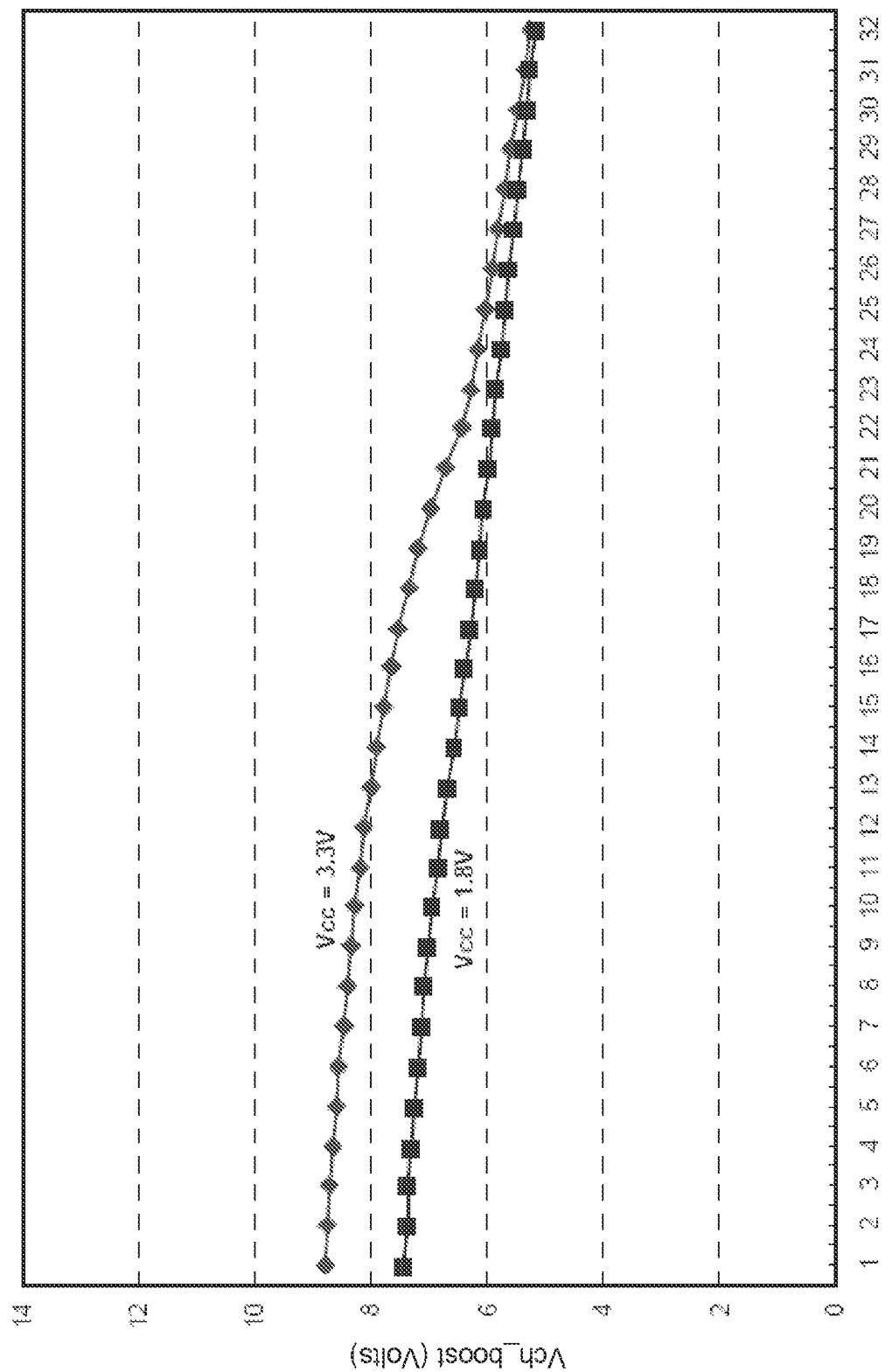
FIG. 5 is a simulation plot of boosted channel voltage versus cell position for prior art sequential programming operations.

FIG. 5 is a simulation result plotting the resulting boosted channel voltage against the BDPD for VDD=3.3V and VDD=1.8V. The NAND string is programmed from the bottom memory cell coupled to WL0 to the top cell coupled to WL31. As programming reaches the upper memory cells, the level of Vch_boost significantly decreases. Moreover, when programming from WL25 to WL31, the boosted channel voltage is below 6V for both VDD of 3.3V and 1.8V, which are insufficiently high to inhibit programming. Therefore the sequential program scheme of the prior art does not fully resolve the program stress issue.

An improvement to the above described sequential programming scheme is achieved by local self boosting, as is described by Tae-Sung Jung et al., in the paper titled "A 117-mm2 3.3-V Only 128-Mb Multilevel NAND Flash Memory for Mass Storage Applications", vol. 31, no. 11, pp. 1575-1583, November 1996. In the Tae-Sung Jung et al. sequential programming scheme, Local Self Boosting (LSB) is used by decoupling a selected memory cell from the NAND string by reducing the gate voltage of the upper and lower adjacent memory cells to the selected memory cell, to 0V. Thus the selected memory cell will experience greater boosting in its channel relative to the prior art NAND string channel boosting when the programming voltage is applied. However, the upper adjacent memory cell to the selected memory cell must be erased to pass the bitline voltage of 0V for programming. While channel boosting of the selected memory cell is improved, random page programming still cannot be executed because the applied 0V level on the upper adjacent memory cell will only allow it to pass the bitline voltage if it is erased.

Figure 6:
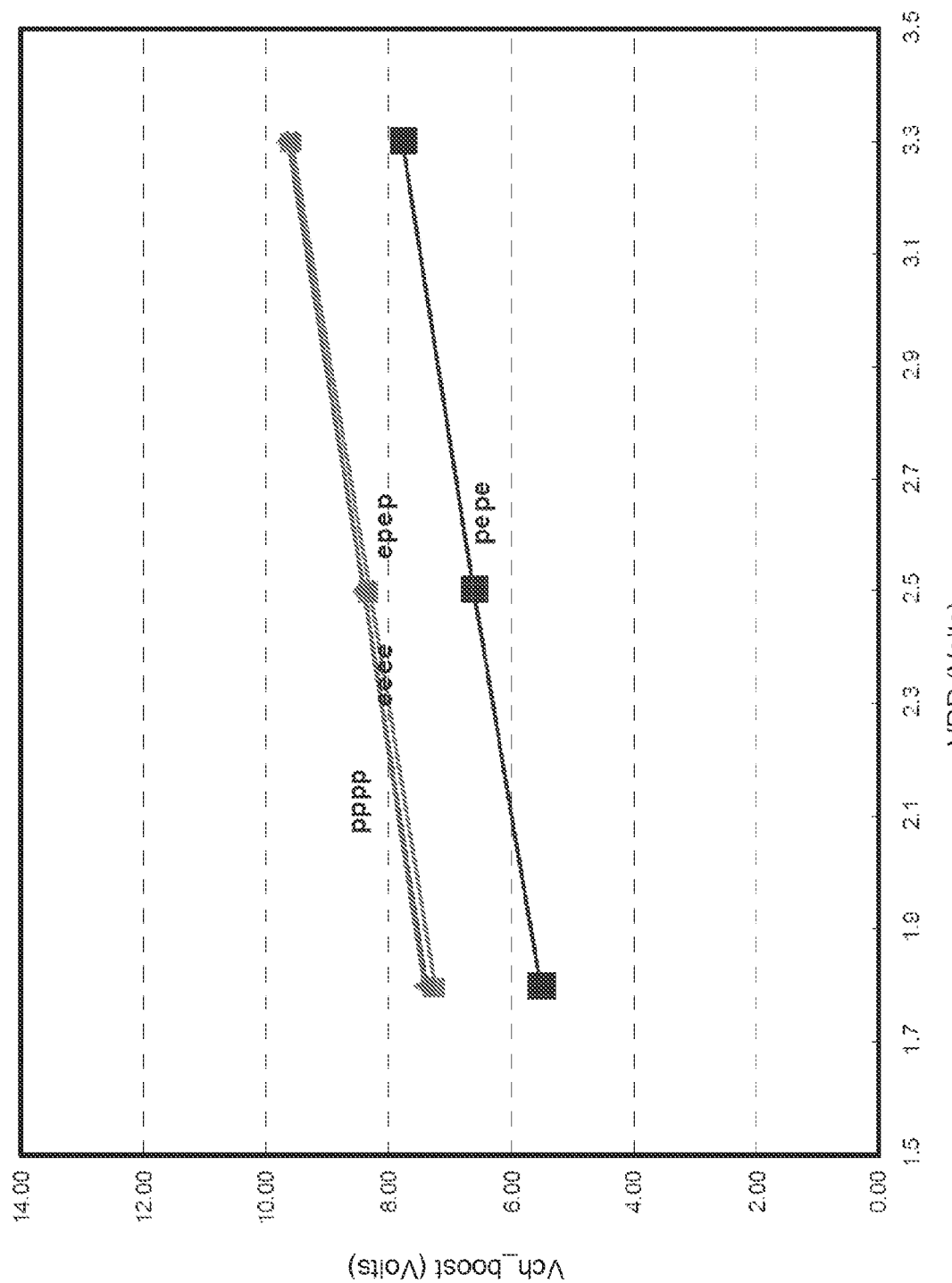
FIG. 6 is a simulation plot of boosted channel voltage versus VDD for different background data patterns for a prior art locally boosted sequential programming scheme.

FIG. 6 is a simulation result plotting the resulting boosted channel voltage against VDD for four different scenarios using the locally boosted sequential programming scheme of Tae-Sung Jung et al. For this simulation, Vpgm=18V, Vpass=8V, the erased threshold voltage of a memory cell is Vthc_erase=−3V and the programmed threshold voltage of a memory cell is Vtch_pgm=2V. In a first scenario, all the lower memory cells to the selected memory cell of the NAND string are programmed. This corresponds to plotted curve labeled "pppp" in FIG. 6. In a second scenario, all the lower memory cells are erased, which corresponds to the plotted curve labeled "eeee". In a third scenario, the lower memory cells are alternately erased and programmed, which corresponds to the plotted curve labeled "epep". In a fourth scenario, the lower memory cells are alternately programmed and erased, which corresponds to the plotted curve labeled "pepe". As shown in FIG. 6, the "pppp", "eeee" and "epep" curves are substantially overlapping, and all have a strong dependency on VDD. The "pepe" curve has a substantially lower Vch_boost relative to the other curves due to the dependency on the background data, and also has a strong dependency on VDD. Hence, this conventional local self boosting program scheme does not consistently provide enough boosted channel voltage to prevent programming.

Figure 7:
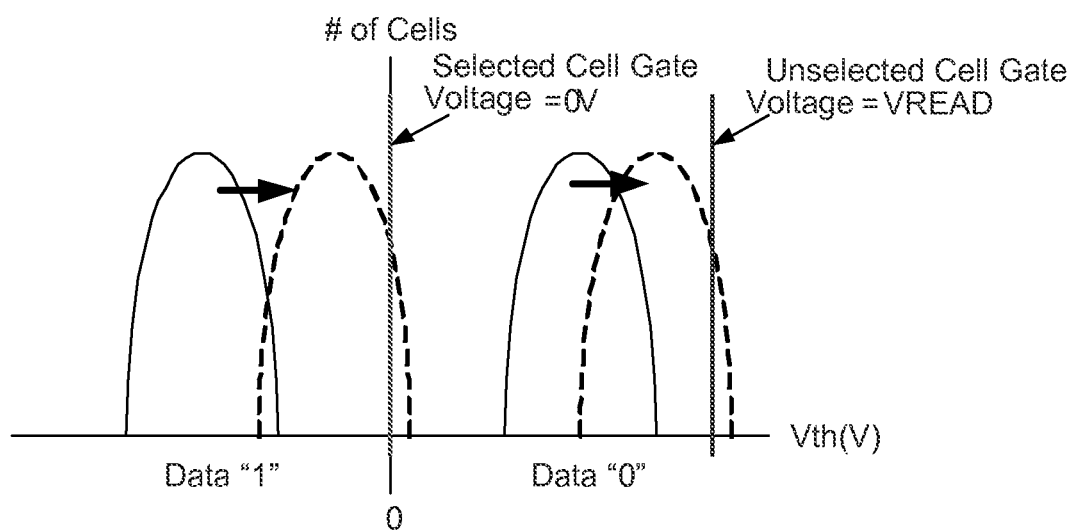
FIG. 7 is a threshold voltage (Vt) distribution graph for erased memory cells and programmed memory cells after being program disturbed.

Therefore, NAND flash memory devices employing the prior art programming schemes are still subjected to programming voltage stress and pass voltage stress, resulting in shifted threshold voltages for the programmed and erased memory cells, as shown in FIG. 7. Furthermore, these disadvantages exist even when the NAND flash memory cells are programmed sequentially, which limits the operational flexibility of the memory device.

FIG. 7 shows threshold voltage (Vt) distribution graph for program disturbed erased memory cells and programmed memory cells, and example applied gate voltages for selected and unselected cells. For example, a non selected cell receives a gate voltage as shown in FIG. 7 as Unselected Cell Gate Voltage=Vread, while a selected cell receives a different gate voltage as shown in FIG. 7 as Selected Cell Gate Voltage=0V. The solid curves correspond to the threshold distribution originally shown in FIG. 3, while the dashed curves show the shifted threshold distribution due to program disturb. This shifting can be due to accumulated number times a cell is disturbed, or a single program disturb event. This is very problematic as the shifted thresholds can affect read operations that employ preset wordline read voltages based on the expected threshold voltages shown in FIG. 3. These aforementioned disadvantages will continue to worsen with continued scaling down of semiconductor fabrication technology, as the power supply VDD will is also scaled to a lower level.

In the following description of the embodiments, a selected memory cell will refer to the memory cells in each NAND string coupled to the same wordline that is addressed for a programming operation. Accordingly, all the selected memory cells are referred to as a page of data. A lower adjacent memory cell to the selected memory cell will refer to the memory cell positioned between the selected memory cell and the source line. An upper adjacent memory cell to the selected memory cell will refer to the memory cell positioned between the selected memory cell and the bitline. A programmed page of data will correspond to memory cells coupled to the same wordline that has been previously subjected to a programming operation, which is either inhibited from being programmed or allowed to be programmed.

Figure 8:
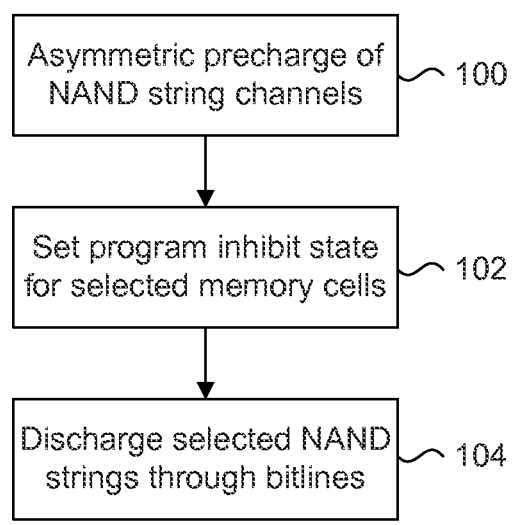
FIG. 8 is a flow chart illustrating an embodiment of general NAND flash programming method.
Figure 9:
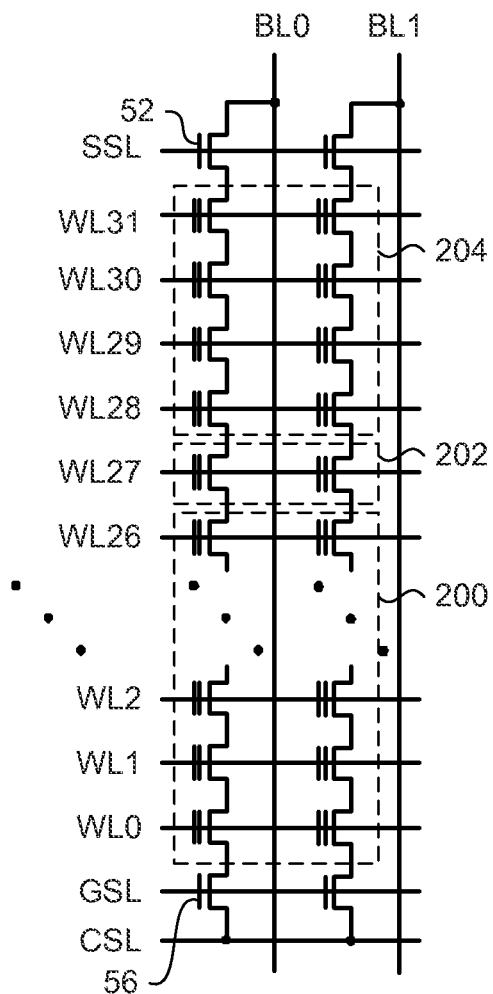
FIG. 9 is a circuit schematic of two NAND memory cell strings with annotations to show relative locations of channel groupings.

FIG. 8 is a flow chart showing the general method embodiment of the source side asymmetrical precharge programming scheme, with reference to the circuit schematic of the NAND strings of FIG. 9. The circuit schematic of FIG. 9 is identical to that previously shown in FIG. 2a. The method of FIG. 8 begins with a first precharge step 100, where the source line is used to precharge the channels of the NAND string at step 100, and certain channel areas corresponding to memory cells of the NAND string are boosted to different voltage levels. In the present embodiment, the NAND string channel areas are defined by the position of the selected memory cell, where a selected memory cell is to be programmed. In the example shown in FIG. 9, the memory cell coupled to WL26 is the selected memory cell. With the selected memory cell being coupled to WL26, the channels of the memory cells coupled to WL0 to WL26 will be a lower channel 200 of the NAND string. The "lower channel" label is specific to the example of FIG. 9 because these memory cells are proximate to the source line CSL. The channel corresponding to the upper adjacent memory cell to the selected memory cell coupled to WL27 is an intermediate channel 202, and the channels of the memory cells coupled to WL28 to WL31 will be an upper channel 204. Generally, in a NAND string arrangement such as the one shown in FIG. 9, the lower channel will be the series grouping of channels proximate to the source line CSL, the upper channel will be the series grouping of channels proximate to the bitline (BL0 or BL1), and the intermediate channel will be adjacent to the selected memory cell channel and the upper channel.

With this definition of the channel areas of the NAND string, asymmetrical precharging of the NAND string means that each of the lower, intermediate and upper channels of the NAND string will be set to different voltage levels. More specifically, the end result of the asymmetrical precharging is that a maximum amount of positive voltage from CSL is passed to the selected memory cell coupled to WL26, the source voltage of the string select transistor 52 is greater than VDD−Vth_sst, where Vth_sst is the threshold voltage of string select transistor 52, and the memory cell corresponding to the intermediate channel 202 passively turns off as the lower channel 200 and the upper channel 204 are precharged. In the present embodiment, the asymmetrical precharging is achieved by driving the wordlines to different pass voltages as CSL is coupled to the NAND string via ground select transistor 56. Further details of these pass voltages will be discussed later.

Once the NAND string has been set to the above noted conditions, a second precharge step is executed at step 102 by setting the selected memory cells to a default program inhibit state. This is done by local boosting of the selected memory cell channel in response to an applied programming voltage. When the selected memory cell channel is locally boosted, it will be sufficiently high to prevent F-N tunneling from occurring, thereby inhibiting programming of the selected memory cell. Further details of the local boosting will be described later. It is noted that the default program inhibit state is set for all the selected memory cells regardless of the bitline data, as the bitlines are decoupled from the NAND strings at this time. Collectively, steps 100 and 102 are considered the asymmetrical precharge phase of the presently described source side asymmetrical precharge programming scheme embodiment.

The programming phase will then commence at step 104 by coupling all the NAND strings to their respective bitlines. In one embodiment, the bitlines will have already been driven either to VDD or VSS in steps 100 or 102, depending on the program data. If the bitline is at VDD, then the selected memory cell will remain at the default program inhibit state. If the bitline is at VSS, then the channel of the selected memory cell is discharged to VSS by the bitline, through the upper adjacent memory cell to the selected memory cell and the memory cells corresponding to the upper channel. Once the channel of the selected memory cell is discharged to VSS, then the high potential difference between the channel and the program voltage will be sufficient to enable F-N tunneling, thereby programming the selected memory cell.

Figure 10:
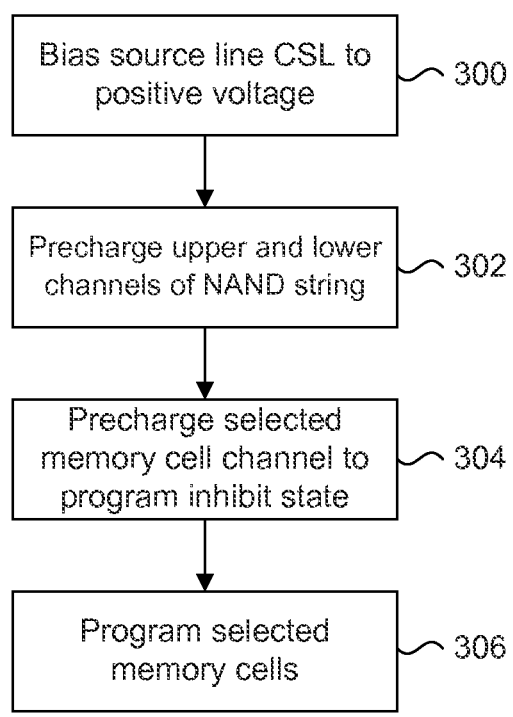
FIG. 10 is a flow chart illustrating an embodiment of a source side asymmetrical precharge programming scheme.
Figure 11A:
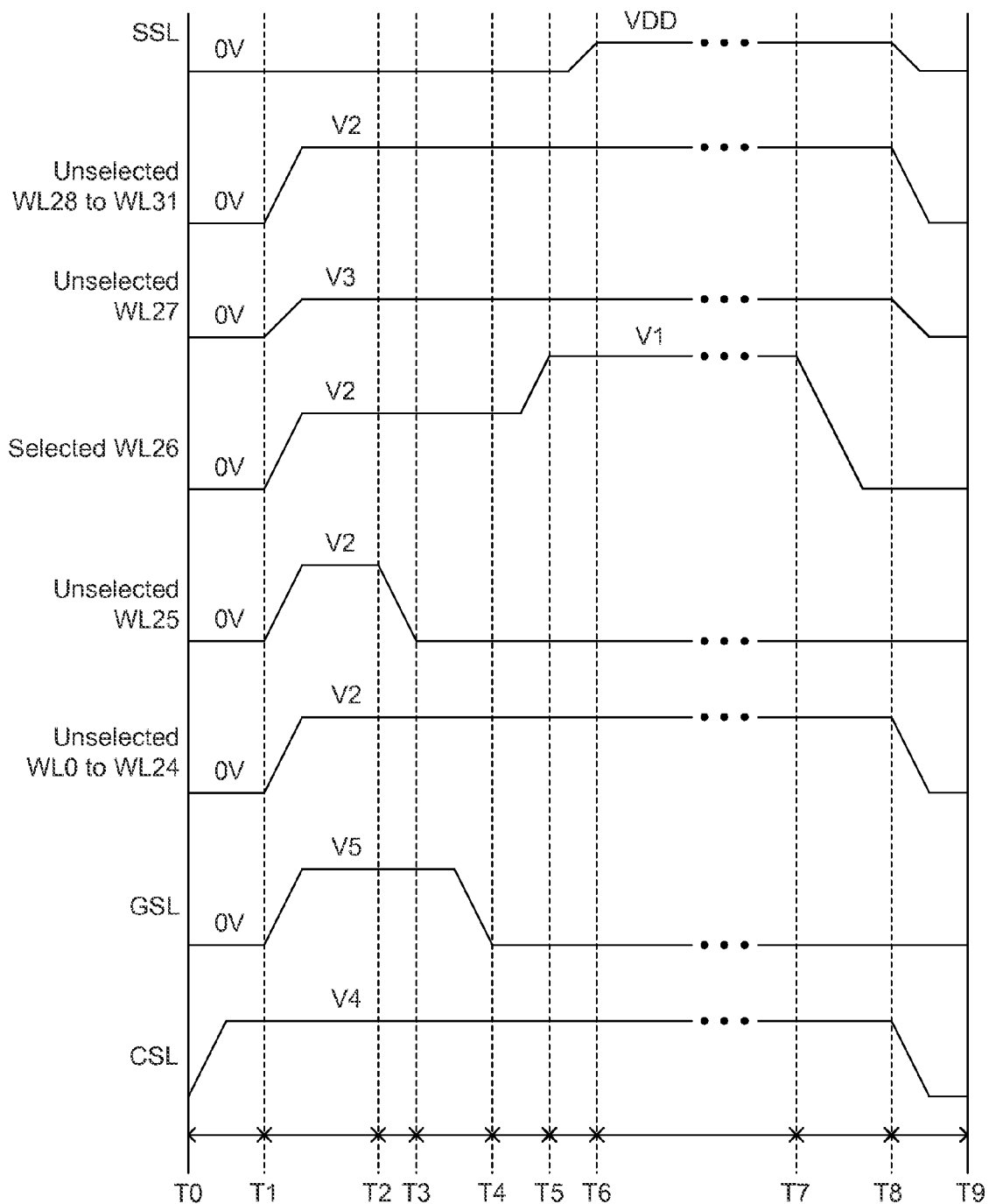
FIG. 11A is a sequence diagram illustrating an example operation of the source side asymmetrical precharge programming embodiment.

FIG. 10 is a flow chart of a method for programming a NAND flash memory cell string with minimum program stress, according to an embodiment of the invention. The description of the present method will be made with reference to the circuit schematic of the NAND strings in FIG. 9, and the sequence diagram shown in FIG. 11A. The sequence diagram of FIG. 11A shows signal traces for the string select signal SSL, the wordlines WL0 to WL31, the ground select signal GSL, and the common source line CSL. These signals are driven to voltage levels V1, V2, V3, V4 and V5 in the present programming method, with the following relationships:

$$V1>V2>V3 \quad (1)$$

$$V5>=V4 \quad (2)$$

V3>Vthc_pgm, where Vthc_pgm is the threshold voltage for a programmed memory cell. (3)

Table 1 below lists sample values for the listed parameters to help illustrate the electrical effect of the presently described programming scheme. The sample values in Table 1 can be used for a specific process technology and cell characteristics. Those skilled in the art will understand that these values will vary with different process technologies, cell characteristics, and number of memory cells per NAND string. All values, except for V3 and V4, are typical for current NAND flash memory devices. Current NAND flash memories do not employ a V3 pass voltage and typically employ a V4 between VSS and VDD.

TABLE 1

| Parameter | Value | Parameter | Value |
|---|---|---|---|
| Number of cells per NAND string | 32 | V1 | Vpgm = 18 V |
| VDD | 3.3 V, 2.5 V or 1.8 V | V2 | Vpass = 10 V |
| Vth_sst (threshold voltage of transistor 52) | 0.8 V | V3 | Vdcp = 4 V |
| Vth_gst (threshold voltage of transistor 56) | 0.8 V | V4 | Vcsl = 10 V |
| Vthc_pgm of erased memory cells | −3.0 V | V5 | Vgsl = 10 V |
| Vthc_erase of programmed memory cells | 2.0 V | Bitline data logic "1" (program inhibit) | VDD |
| Cell coupling ratio (γ) | 0.7 | Bitline data logic "0" (program) | VSS |

The initial state of all the wordlines, CSL, SSL and GSL is VSS, and in the present example the selected memory cell to be programmed is coupled to WL26. The programming method begins at step 300 by biasing the source line CSL to V4, as shown between time T0 to T1 in FIG. 11A. Following at step 302 is a first asymmetrical precharge phase for precharging the lower channel 200 and the upper channel 204 to different voltage levels. This first asymmetrical precharge phase includes coupling CSL to the NAND string by driving GSL to V5 between time T1 to T2, and driving all the wordlines except for wordline WL28 coupled to the upper adjacent memory cell to the selected memory cell, to V2 between time T1 to T2. WL27 is driven to the lower V3 voltage level. The lower channel 200 that includes unselected memory cells coupled to WL0 to WL26, will be precharged to at least V2−Vgst−Vthc_pgm. This assumes that at least one of the pages corresponding to WL0 to WL26 has been previously subjected to a programming operation. Using the values in Table 1, this will be approximately 7.2V.

Because WL27 and WL28 to WL31 are driven from the initial 0V level, when these wordlines reach V3 both the intermediate channel 202 and the upper channel 204 will be precharged to at least V3−Vthc_pgm, which is 2V using the values in Table 1. It is noted that this is a worst case condition, and the upper channel 204 will be precharged to different voltage levels if the memory cell corresponding to the intermediate channel 202 is erased. In a first case, if all the memory cells corresponding to the lower channel 200 are in the erased state, upper channel 204 will be precharged to either V3+Vthc_erase (<V4) or V4 (<V3+Vthc_erase). In a second case, if all the memory cells corresponding to the lower channel 200 are in the programmed state, upper channel 204 will be precharged to either V3+Vthc_erase (<V2−Vthc_pgm) or V2−Vthc_pgm (<V3+Vthc_erase). This assumes that the upper adjacent memory cell to the selected memory cell coupled to WL27 is part of a page previously subjected to programming to have a positive threshold voltage. On the other hand, if the upper adjacent memory cell to the selected memory cell is in the erased state, then its channel is precharged to V3−Vthc_erase, which is 5V using the Table 1 values. The voltage level of wordlines WL28 to WL31 continues to V2, which causes channel boosting in the upper channel 204. More specifically, the upper channel 204 will be boosted by V2−V3, and eventually, the upper adjacent memory cell to the selected memory cell will be passively turned off by the boosted channel voltage of the upper channel 204.

Following at step 304 is a second asymmetrical precharge phase for precharging the channel of the selected memory cell to a program inhibit state. This second asymmetrical precharge phase begins at time T2 when the lower adjacent memory cell to the selected memory cell coupled to WL25 is turned off by driving WL25 to VSS, followed by the turning off ground select transistor 56 by driving GSL to VSS between time T3 to T4. Therefore, the selected memory cell coupled to WL26 is decoupled from the NAND string. Between time T4 to T5, WL26 for the selected memory cell is driven to the programming voltage V1, thereby locally boosting its channel to approximately Vbch=Vich+γ*(V1−V2), where Vich is the precharged voltage level of the channel resulting from the first asymmetric precharge phase of step 302. Using the example values of Table 1, Vbch=7.2V+0.7V*(18V−10V)=12.8V. The differential between the boosted channel voltage and the programming voltage will inhibit F-N tunneling, and is thus referred to as a program inhibit state of the selected memory cell. Any voltage sufficient for inhibiting programming in the presence of the applied programming voltage will place the channel in the program inhibit state. Therefore, all the selected memory cells will be precharged to this program inhibit state at time T5.

The asymmetrical precharging phase of the presently described source side asymmetrical precharge programming scheme embodiment ends with the end of the second asymmetrical precharge phase. The second asymmetrical precharge phase ends shortly after WL26 reaches V1 to cause local boosting of the selected memory cell channel. Following at step 306 is the programming phase where bitline data is applied to the NAND strings. It is noted that the bitlines are previously driven to either VDD or VSS any time prior to step 306. Between time T5 to T6, string select transistor 52 is driven to VDD to couple the NAND strings to their respective bitlines. If the bitline is set to VDD, then the string select transistor 52 will remain turned off because both its source voltage and drain voltage will be greater than Vth_sst. More specifically, the source voltage is the boosted voltage level of the upper channel 204, while the drain voltage will be at VDD. Hence the boosted charge in the channel of the selected memory cell is maintained, thereby preventing programming.

On the other hand, if the bitline is set to VSS, then the string select transistor 52 will turn on. The upper channel 204 will discharge to VSS, which will turn on the upper adjacent memory cell to the selected memory cell to discharge the intermediate channel 202 to VSS. Therefore, the boosted voltage level of the selected memory cell channel will discharge to VSS, and the necessary voltage differential across its floating gate will be established. The period between time T6 to T7 is the actual programming period where electrons tunnel into the floating gate oxide of the selected memory cells coupled to a VSS biased bitline, to effect programming. Those skilled in the art will understand that time period T6 to T7 is longer than the previously shown time periods, and selected to ensure that the selected memory cell is sufficiently programmed. The actual length of time period T6 to T7 will depend on the process technology and voltages being used. At time T7, the programming phase is ended by driving WL26 to VSS, and at time T8 all the remaining wordlines, SSL and CSL are driven to VSS.

Figure 11B:
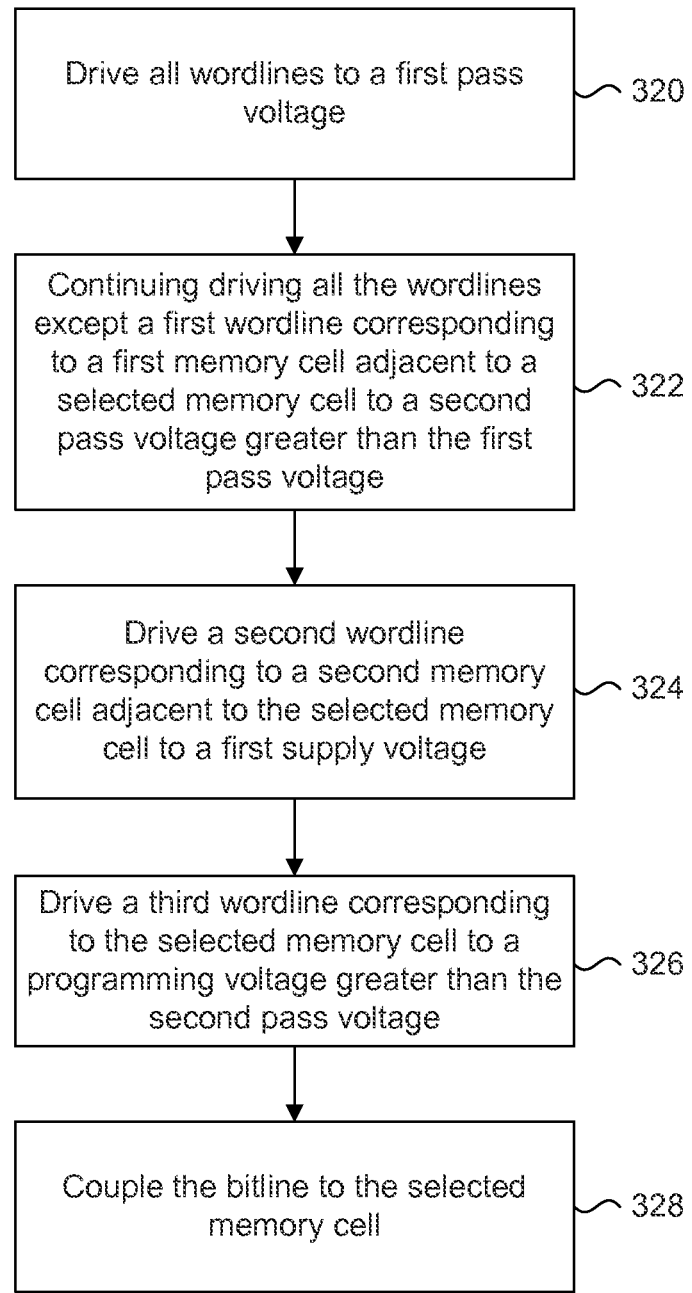
FIG. 11B is a flow chart illustrating an example source side asymmetrical precharge programming method based on the embodiment shown in FIG. 11A.

A summary of the example operation of FIG. 11A is described with reference to the flow chart of FIG. 11B. The method for programming begins at 320 by driving all wordlines to a first pass voltage for coupling a string precharge voltage provided by the source line to the memory cells, the string precharge voltage being greater than the first pass voltage. The method proceeds to 322 by continuing driving all the wordlines except a first wordline corresponding to a first memory cell adjacent to a selected memory cell to a second pass voltage greater than the first pass voltage, where the first memory cell is positioned between the selected memory cell and the string select device. Following 322, the method includes driving a second wordline corresponding to a second memory cell adjacent to the selected memory cell to a first supply voltage for turning off the second memory cell at 324. Following 324, the method includes driving a third wordline corresponding to the selected memory cell to a programming voltage greater than the second pass voltage at 326. Finally at 328, the bitline is coupled to the selected memory cell.

Figure 12:
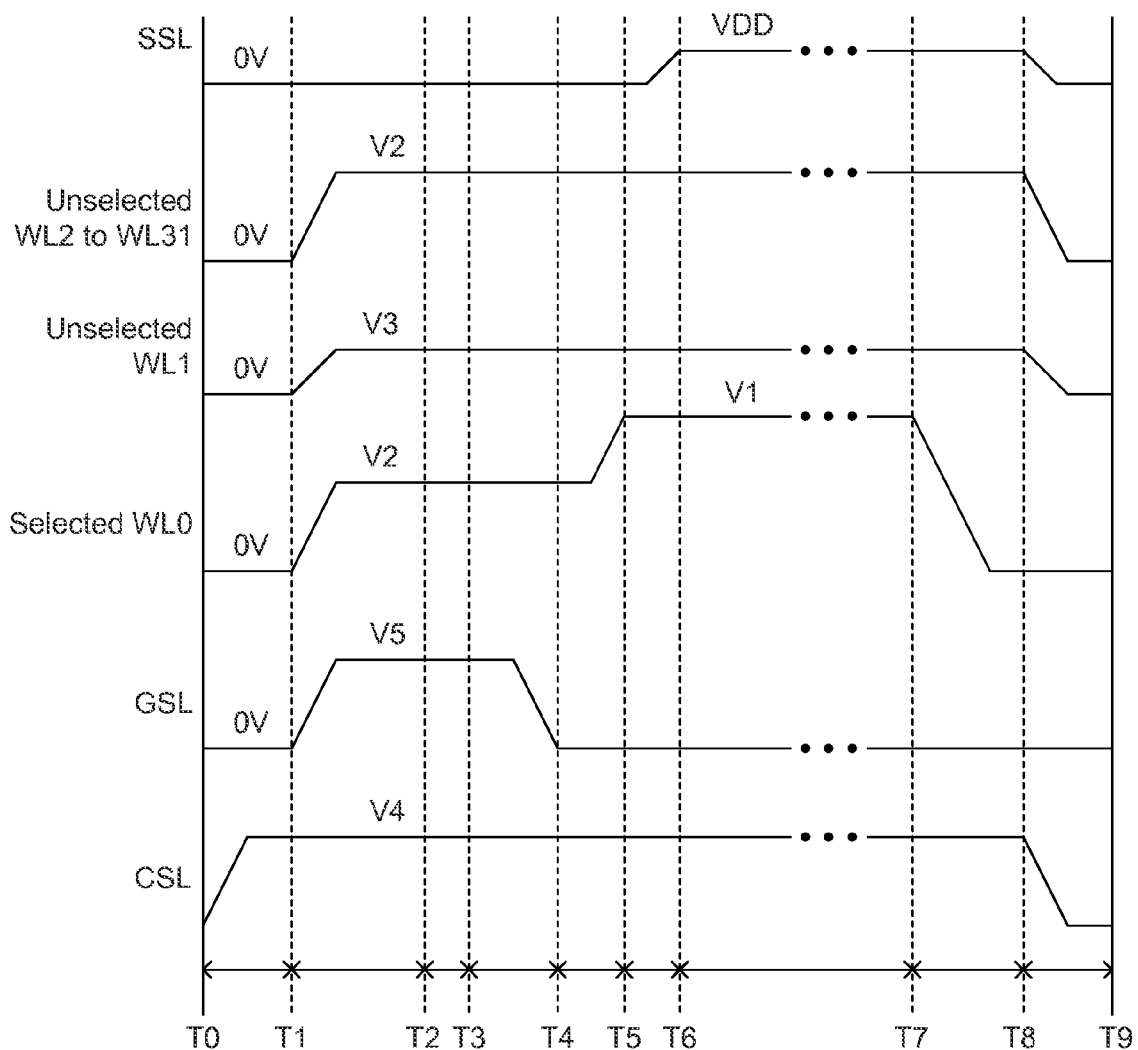
FIG. 12 is a sequence diagram illustrating another example operation of the source side asymmetrical precharge programming scheme embodiment.
Figure 13:
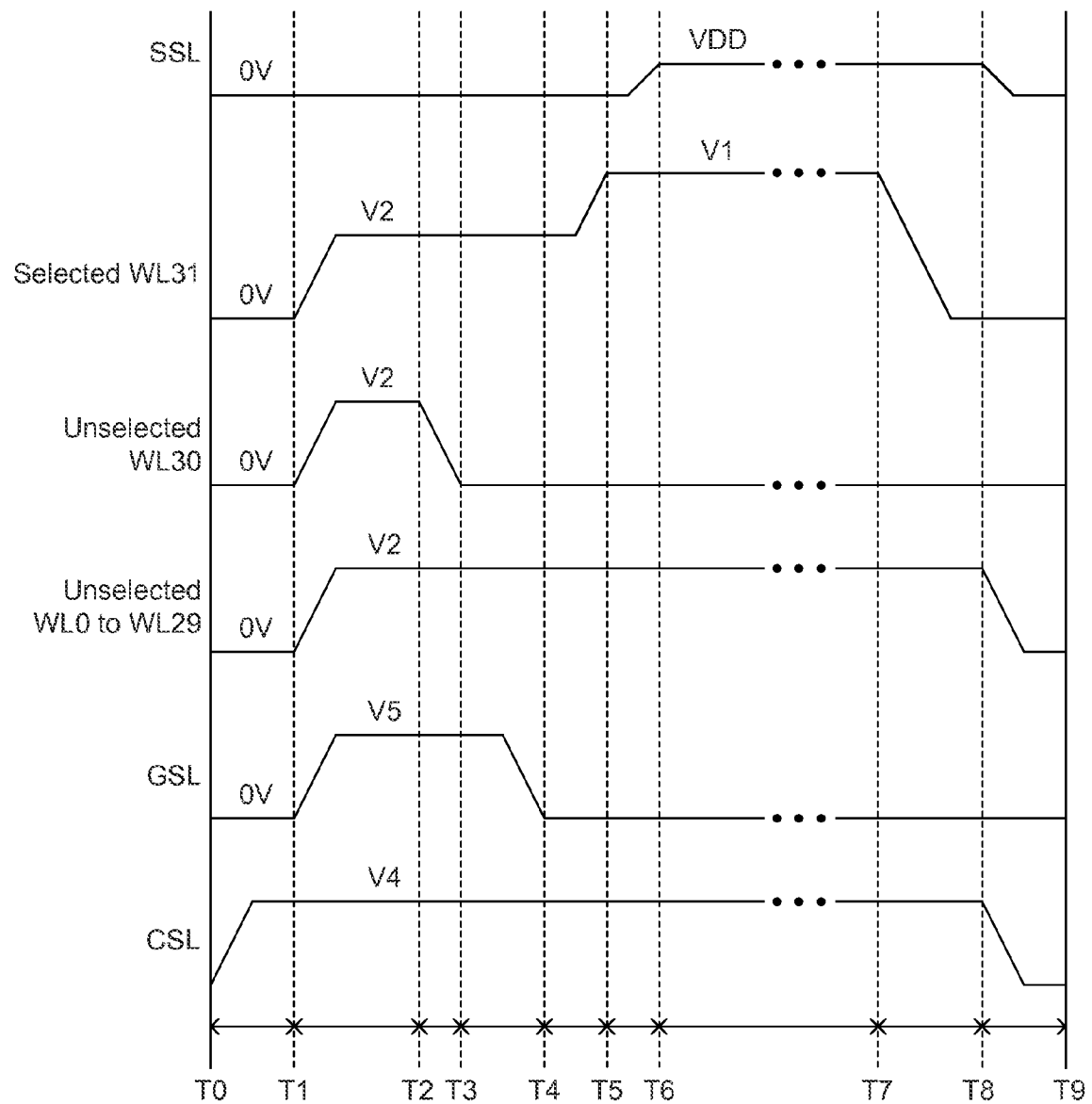
FIG. 13 is a sequence diagram illustrating yet another example operation of the source side asymmetrical precharge programming scheme embodiment.

The previously described example operation is based on a selected memory cell bounded by an upper adjacent memory cell and a lower adjacent memory cell. There will be two instances where the selected memory cell will be bounded by only an upper adjacent memory cell and a lower adjacent memory cell. In the first case, the selected memory cell is coupled to the first wordline WL0, the closest memory cell to the source line CSL. In the second case, the selected memory cell is coupled to the last wordline WL31, the closest memory cell to the bitline. FIGS. 12 and 13 are sequence diagram illustrating how the embodiments of the present NAND string programming method are applicable to these two cases.

FIG. 12 is a sequence diagram similar to that shown in FIG. 11A, illustrating the sequence of voltages being applied to NAND string of FIG. 2a when the selected memory cell is coupled to WL0. The same time periods shown in FIG. 11A are illustrated in FIG. 12. In this situation, there is no lower adjacent memory cell to the selected memory cell. More specifically, there is only the ground select transistor 56 between the selected memory cell and the source line CSL. The main difference over the programming sequence of FIG. 11A is that the lower channel consists only of the selected memory cell. Because there is no lower adjacent memory cell to the selected memory cell to turn off between time T2 to T3 in step 304 of FIG. 13, the selected memory cell is then decoupled by the action of turning off ground select transistor 56 between time T3 to T4. If desired, the timing for turning off ground select transistor 56 can be adjusted to occur earlier between time T2 to T3. Then the remaining programming sequence is unchanged relative to that of FIG. 11A.

FIG. 13 is a sequence diagram similar to that shown in FIG. 11A, illustrating the sequence of voltages being applied to NAND string of FIG. 2a when the selected memory cell is coupled to WL31. The same time periods shown in FIG. 11A are illustrated in FIG. 13. In this situation, there is no upper adjacent memory cell to the selected memory cell. More specifically, there is only the string select transistor 52 between the selected memory cell and the source line CSL. Hence there is no intermediate channel and upper channel between the selected memory cell channel and the bitline. Accordingly, there is no need for precharging of the intermediate channel and the upper channel between time T2 and T3 in step 302 to passively turn off the upper adjacent memory cell. The string select transistor 52 that is turned off between time T1 to T5, with the lower adjacent memory cell to the selected memory cell coupled to WL30 will isolate the selected memory cell. The remaining programming sequence is unchanged relative to that of FIG. 11A.

In the previously described embodiments, several features should be noted. By setting CSL, GSL and V2 to be the same, the lower channel 200 that includes the selected memory cell channel will be precharged to a level independent of VDD, without any channel boosting since VDD biased bitlines are not applied to the NAND strings during the precharge phase. Even if all the memory cells in the lower channel 200 have been previously programmed to a positive threshold voltage, which is a worst case precharge scenario, the combination of V2=GSL=CSL will ensure that the worst case precharge level is V2−Vgst Vthc_pgm. When locally boosted, the selected memory channel will reach a high voltage level that is more than sufficient for minimizing Vpgm stress. Therefore, there is no background data pattern dependency to affect programming or program inhibiting of the memory cells corresponding to the lower channel 200.

By limiting only the wordline voltage applied to the upper adjacent memory cell to the selected memory cell to a voltage lower than V2, upper channel 204 will be boosted to passively turn off the upper adjacent memory cell as their corresponding wordlines continue to up to V2. Thus, no active turning off of the upper adjacent memory cell is required, which simplifies the wordline decoding control logic.

The precharged NAND strings will only be responsive to a VSS biased bitline after the precharge phase, when the selected memory cell has its wordline driven to the programming voltage Vpgm. Any bitline biased to VDD and applied to the precharged NAND string will have no effect on the precharged state of the NAND string, and most importantly, the selected memory cell in the program inhibit state. Therefore, there is no background data pattern dependency to affect programming or program inhibiting of the memory cells corresponding to the intermediate channel upper 202 and the upper channel 204.

Figure 15:
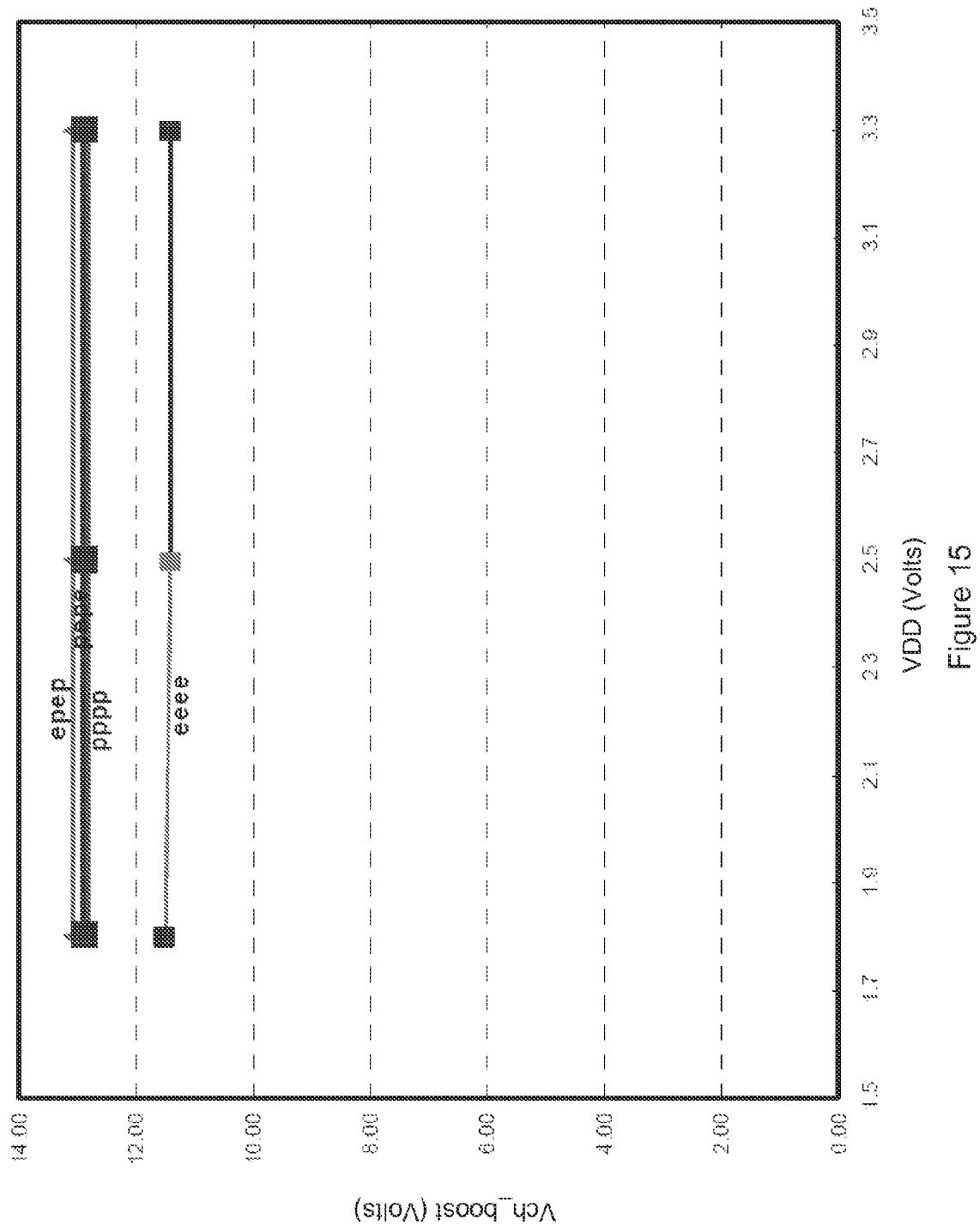
FIG. 15 is a simulation plot of boosted channel voltage versus VDD for different background data patterns for a sequential programming operation using the source side asymmetrical precharge programming scheme.
Figure 16:
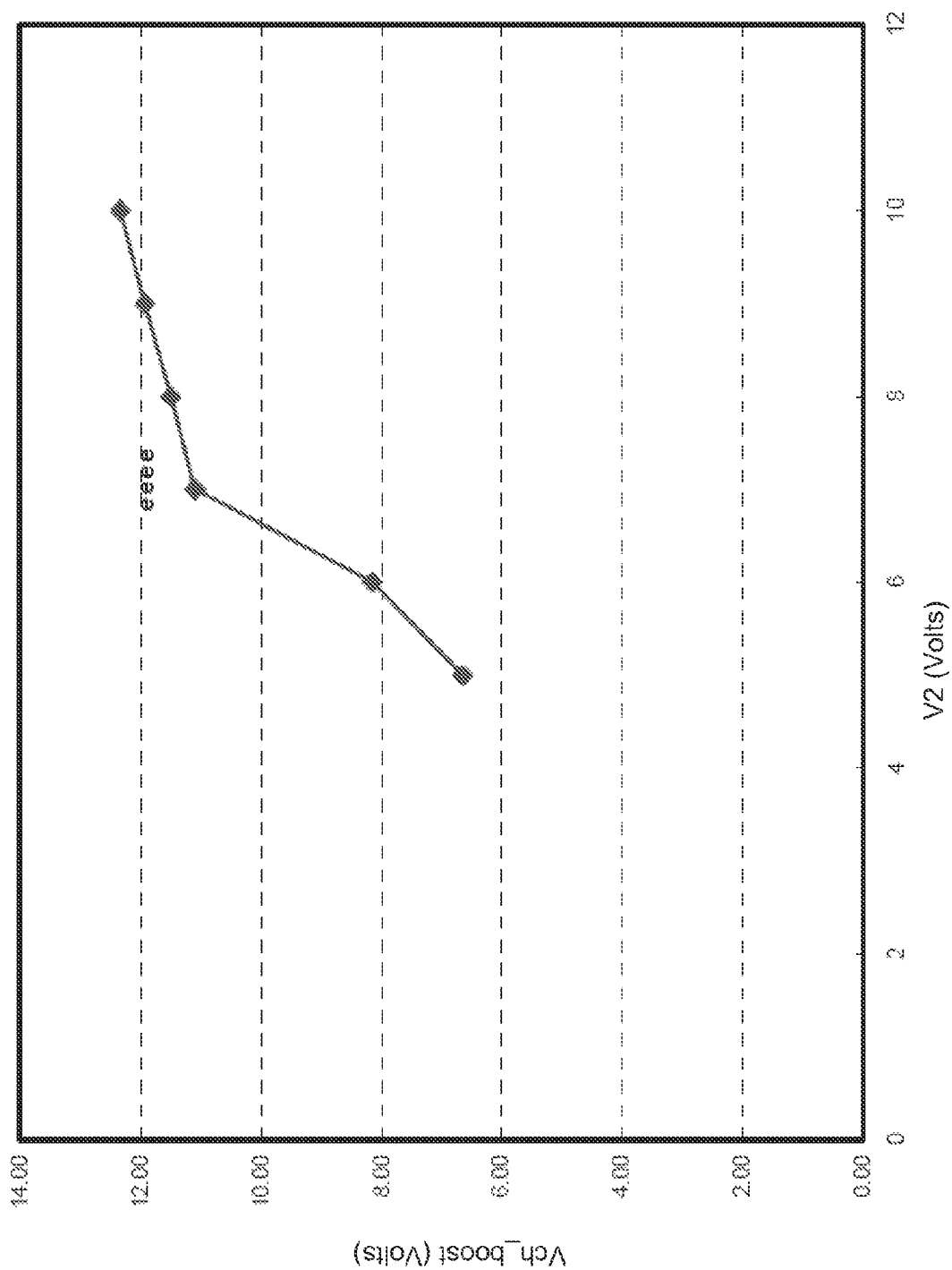
FIG. 16 is a simulation plot showing the relationship between boosted channel voltage and pass voltage for the present embodiments.

Random page programming can be executed because the upper adjacent memory cell to the selected memory cell has its gate driven to V3, which is less than V2 but greater than the programmed positive threshold voltage. Therefore the upper adjacent memory cell will always turn on to couple the VSS biased bitline to the selected memory cell. The effectiveness of the presently described NAND flash programming scheme has been simulated, and the results are shown in FIGS. 14 to 16.

Figure 14:
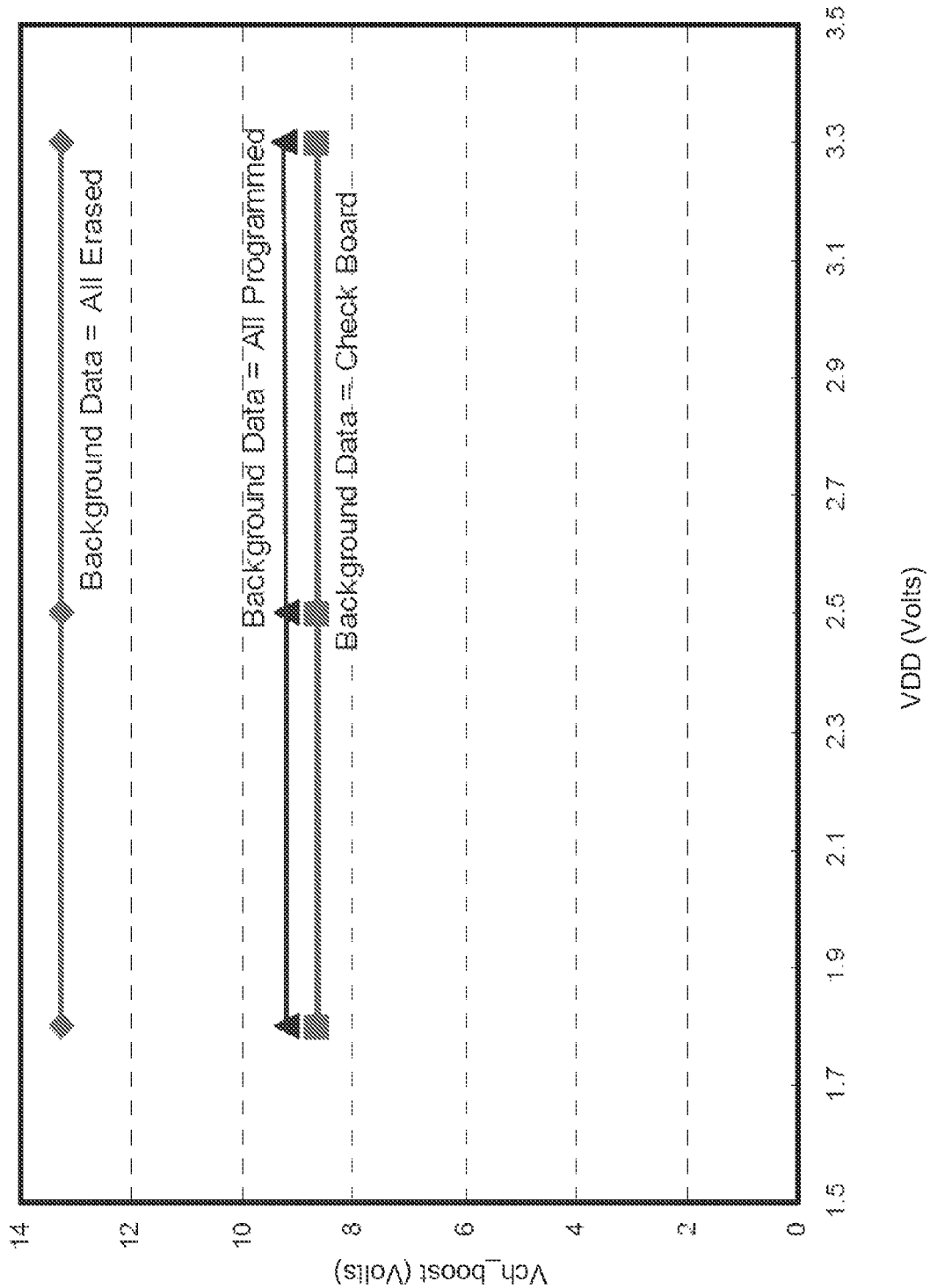
FIG. 14 is a simulation plot of boosted channel voltage versus VDD for different background data patterns resulting from the source side asymmetrical precharge programming scheme embodiments.

FIG. 14 is a simulation showing the boosted channel voltage Vch_boost for the selected memory cell in relation to the supply voltage VDD, using the previously described source side asymmetrical precharge programming scheme embodiment of the present invention and the same voltages used in the simulation shown in FIG. 13. In this simulation Vpgm=18V, Vpass=GSL=CSL=10V, V3=4V, Vth_erase=−3V and Vth_pgm=2V. Three Vch_boost curves have been plotted, one for a case where all the memory cells are erased, which is indicated in FIG. 14 as Background Data=All Erased, one for a case where all the memory cells are programmed, which is indicated in FIG. 14 as Background Data=All Programmed, and one for a case where the NAND string includes a combination of erased and programmed memory cells which is indicated in FIG. 14 as Background Data=Check Board. The minimum final boosted channel voltage Vch_boost is between 8V to 9V for the case where both erased and programmed memory cells are present in the NAND chain, which is sufficient to avoid soft programming (i.e. Vpgm stress) at Vpgm of 18V. It is notable that for the case where all the memory cells are programmed, Vch_boost is between 9V to 10V, while Vch_boost is between 13V to 14V for the case where all the memory cells are erased. If the minimum required final boosted channel voltage for the selected memory cell should be 7V in the presently described examples, then there is margin for reducing Vpass from 10V in order to minimize Vpass stress for the unselected memory cells. It should be clear from a comparison to the simulation of the prior art programming scheme of FIG. 4, that the presently described embodiments will consistently provide a greater final boosted channel voltage for selected memory cells.

The case where all the memory cells are in the erased state in FIG. 14 is analogous to a sequential programming scheme that requires certain memory cells to be in the erased state. Therefore, Vpass can be further reduced by applying the previously described source side asymmetrical precharge programming scheme to a sequential programming operation. In a sequential programming operation, the basic timing for the application of the signals shown in FIGS. 11A, 12 and 13 will be the same. According to a present embodiment, sequential programming using the source side asymmetrical precharge programming scheme can be executed in either direction. A first direction of the sequential page programming will be from the upper most memory cell coupled to WL31 to the lower most memory cell coupled to WL0, while a second direction will be from the lower most memory cell coupled to WL0 to the upper most memory cell coupled to WL31. Therefore when sequentially programming in either of the first and second directions, there will always be erased pages of memory cells in advance of the selected memory cell in the programming direction. Regardless of the programming direction, the biasing conditions for the wordlines, SSL, GSL and CSL remain as previously described for a NAND string having a lower channel 200, intermediate channel 202 and an upper channel 204.

Returning to FIG. 9, and using the example values of Table 1, the lower channel 200 will always be precharged to up to V4, since all the memory cells are in the erased state. The intermediate channel 202 and the upper channel 204 will be precharged to at least the same values as previously described since there will be background data to account for in the memory cells corresponding to the intermediate channel 202 and the upper channel 204. It should be apparent to a person skilled in the art that with such a high initial precharged channel for the selected memory cell, local boosting will further increase its channel voltage. Therefore the pass voltage V2 can be reduced from 10V to a level that is still greater than V3, but sufficiently high to ensure that the final boosted channel of the selected memory cell is effective for inhibiting programming. Therefore when the NAND string is sequentially programmed using the disclosed NAND flash programming method, fully stress-free (Vpgm stress-free and Vpass stress-free) programming is achieved.

FIG. 15 is a simulation plotting the final boosted channel voltage Vch_boost of the selected memory cell against VDD for four different scenarios. In this simulation, Vpgm=18V, V2=CSL=GSL=8V, V3=4V, Vthc_erase=−3V and Vthc_pgm=2V. In a first scenario, all the lower memory cells to the selected memory cell of the NAND string are programmed. This corresponds to plotted curve labeled "pppp" in FIG. 6. In a second scenario, all the lower memory cells are erased, which corresponds to the plotted curve labeled "eeee". In a third scenario, the lower memory cells are alternately erased and programmed, which corresponds to the plotted curve labeled "epep". In a fourth scenario, the lower memory cells are alternately programmed and erased, which corresponds to the plotted curve labeled "pepe". The simulation results show that even after lowering the pass voltage V2 from 10V to 8V, the boosted channel voltage is greater than 11V regardless of the background data pattern. This is high enough to prevent programming in the selected memory cells. Accordingly, there is still some margin for reducing the pass voltage V2 while maintaining an effective program inhibit state of the selected memory cell.

To determine the optimal pass voltage level for a sequential program operation using the programming method embodiments, a simulation of the final boosted channel voltage Vch_boost against V2 is plotted in FIG. 16. For this simulation, Vpgm=18V, V3=4V, Vthc_erase=−3V, Vthc_pgm=2V, VDD=1.8V, and CSL=GSL=V2. If all the memory cells in the lower channel 200 are in the erased state, FIG. 16 shows that the final Vch_boost level of the selected memory cell will be between 6V to 7V when V2 is set to 5V. While this is the minimum effective program inhibit voltage with Vpgm=18V, setting V2 to 6V will result in Vch_boost rising dramatically to just above 8V. Further increases to V2 will further increase Vch_boost. Therefore, V2 can be selected to minimize both Vpass stress for unselected memory cells and for minimizing Vpgm stress. For example, under these example conditions, an unselected erased memory cell will not experience any Vpass stress when V2 is at 7V, while a selected memory cell having a boosted channel voltage of 11V will not experience any Vpgm stress. Accordingly, programming of the NAND string is stress-free.

Most NAND flash devices execute Incremental Step Pulse Programming (ISPP) to achieve fast program performance under process and environmental variations while maintaining a tight programmed cell distribution. Generally in ISPP operation, the initial Vpgm is approximately 16V. After an initial 16V program pulse, each subsequent pulse that is required is incremented in 0.5V steps up to 20V. In the prior art programming schemes, Vpass determines the final boosted channel voltage Vch_boost. In order to reduce Vpgm stress, Vpass should be incremented as Vpgm is incremented. Therefore, Vpass will need to have a maximum value that is high enough to inhibit program for data '1' at the maximum Vpgm level. As shown in the simulation results for the present embodiments, a single Vpass level can be selected such that one final Vch_boost level is effective for minimizing Vpgm stress for a range of Vpgm values. This means that Vpgm can be stepped from a minimum to a maximum value without having to adjust Vpass. This further reduces wordline control logic overhead.

In summary, the previously described source side asymmetrical precharge programming scheme embodiments use source side precharging of NAND strings to asymmetrically precharge groupings of its channels to different voltage levels, these channel groupings being delineated by the position of the selected memory cell to be programmed. The goal of asymmetrical precharging is to set the selected memory cell to a program inhibit state, which is achieved by boosting the channels of the memory cells between the upper adjacent memory cell and the bitline to a level sufficient for turning off the upper adjacent memory cell. The selected memory cell is fully decoupled from the NAND string when a lower adjacent memory cell is turned off. A programming voltage is applied to the selected memory cell to locally boost its channel to at least a program inhibit voltage level in the absence of applied bitline data. Therefore after asymmetrical precharging, all the selected memory cells are by default set to the program inhibit state. Only NAND strings later coupled to VSS will discharge the selected memory cell channel to VSS, thereby establishing a condition where programming of the selected memory cell will occur.

Specific performance advantages result from the previously described NAND flash programming embodiments. Since SSL remains at VSS throughout the entire precharge phase, the application of the pass voltage will have little to no capacitive coupling effect on the string select transistor 52. Therefore, boosting efficiency of the NAND string channel is maximized. Random page programming operations can be executed since the boosted channel voltage of the selected memory cell will always be at a minimum level sufficient to inhibit programming, regardless of background data patterns in the NAND string and the VDD level. Sequential programming operations can be executed with reduced pass voltages to eliminate Vpass stress on unselected memory cells.

Persons of skill in the art will understand that there can be a variety of circuits for controlling the wordlines in the manner shown in the embodiments, and that there are known voltage generators that can be used for generating and supplying the voltages greater than VDD to the wordline control circuits. Example row control logic that can be used for controlling the wordlines WL0-WL31, string select line SSL, and ground select line GSL according to the previously described method embodiments of the source side asymmetrical precharge programming scheme are illustrated in FIGS. 17 to 19.

Figure 17:
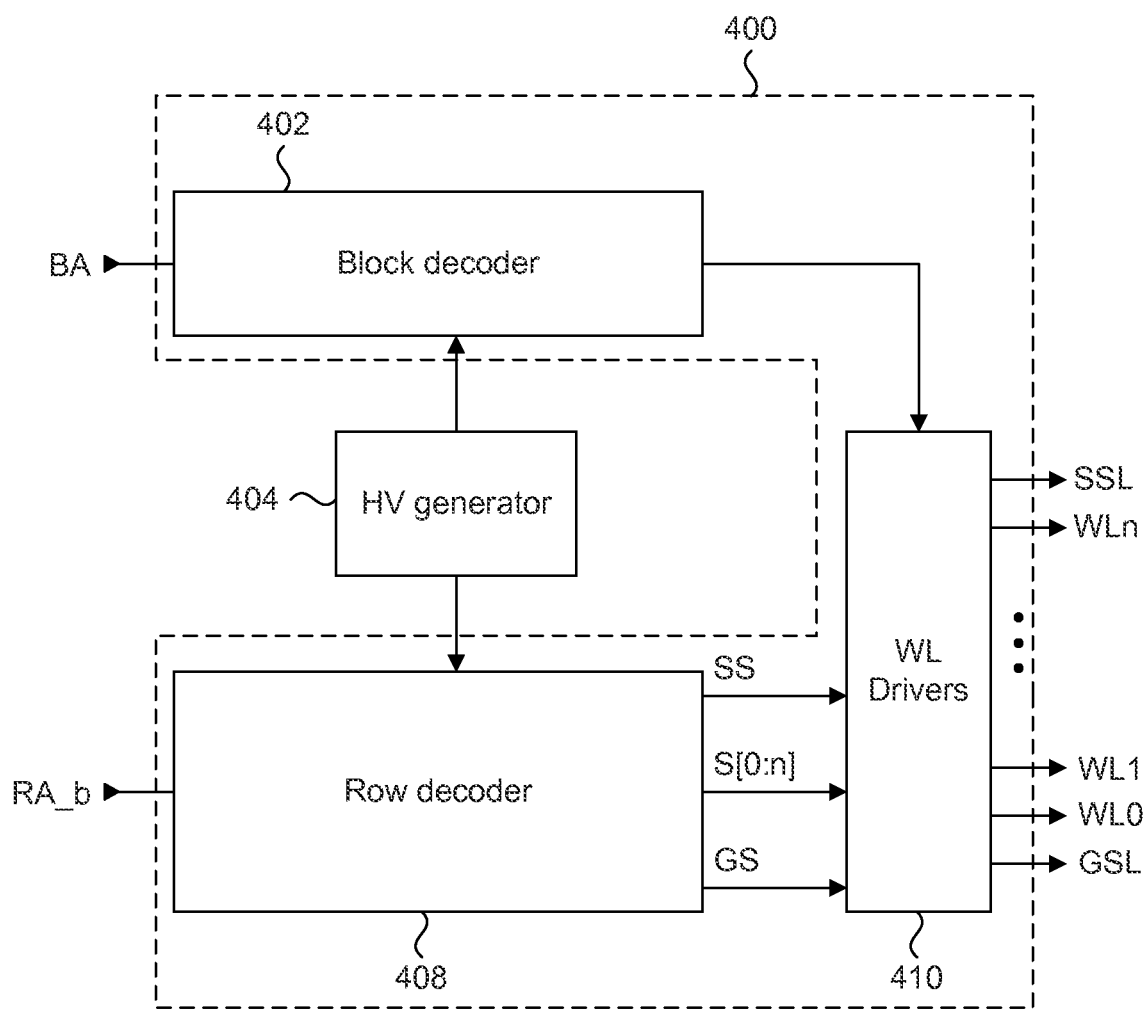
FIG. 17 is a block diagram of the row circuits for a multi-level Flash memory device, according to an embodiment of the present invention.

FIG. 17 is a block diagram of an exemplary row control logic or driver. The driver 400 includes a block decoder 402, a row decoder circuit 408 and a wordline driver circuit 410. The row control logic is controlled by a control circuit such as a command decoder in the flash memory device, in response to received commands such as read and program commands for example. The command decoder of the flash memory device will be configured for executing embodiments of the source side asymmetrical precharge programming scheme. The device having row control logic 400 has a high voltage generator 404, which may be used by other circuits that are not shown in FIG. 17. Generally, high voltage generator 404 will generate at least programming voltage V1, pass voltage V2, reduced pass voltage V3 also referred to as a decoupling voltage Vdcp, CSL voltage V4 and GSL voltage V5. There is one block decoder 402 per memory block, which receives a block address BA, for enabling the wordline drivers. The row decoder 408 is commonly shared among all memory blocks, which receives a row address RA_b, as well as other signals which are not shown, for generating the source select signal SSL, wordline signals S[0:n], and the ground select signal GSL, generically referred to as row signals. In response to a valid block address BA and row decoder signals, signals SSL, GSL and WL0-WLn are set to their required voltage levels during a program operation.

Figure 18:
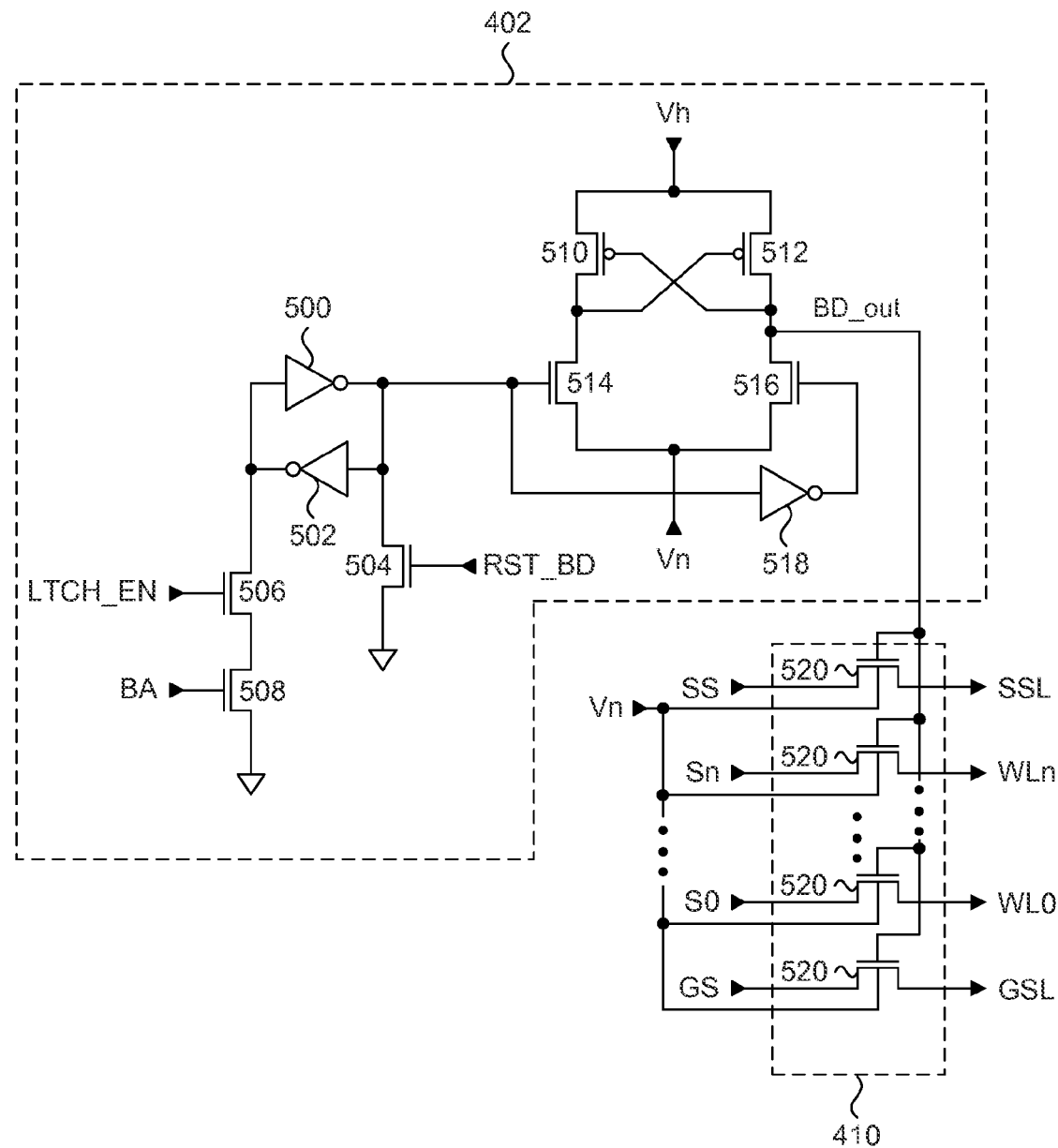
FIG. 18 is a circuit schematic of the block decoder and the wordline driver circuit shown in FIG. 17; and, FIG. 19 is a circuit schematic of the row decoder circuit shown in FIG. 17.
Figure 19:
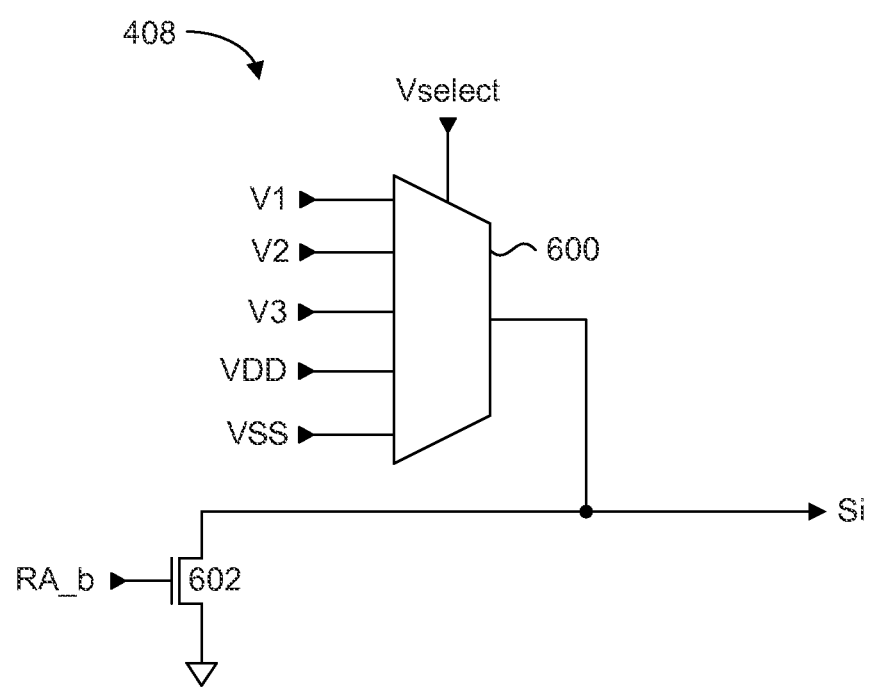

FIG. 18 is a circuit schematic showing circuit details of the block decoder 402 and wordline driver circuit 410 of FIG. 17. Block decoder 402 is associated with one memory block, and includes a cross coupled inverter latch circuit and level shifter circuit. The latch circuit includes cross-coupled inverters 500 and 502, an n-channel reset transistor 504, and n-channel enable transistors 506 and 508. The latch circuit is enabled, or set, when latch enable signal LTCH_EN and a block address BA are at the high logic level. The latch circuit of inverters 500 and 502 is reset when signal RST_BD is at the high logic level. The level shifter circuit includes a pair of cross-coupled p-channel transistors 510 and 512, each being connected to respective n-channel steering transistors 514 and 516. The shared terminals of transistors 510 and 512 receives a high voltage Vh while the shared terminals of transistors 514 and 516 receives a negative voltage Vn. Node Vh is connected to the positive voltage generator 404 while node Vn is connected to VSS or optionally, to a negative voltage generated by a negative voltage generator (not shown). Steering transistors 514 and 516 have gate terminals connected to the output of inverter 500 and inverter 518, the input of which is connected to the gate of transistor 514. It is noted that the operating voltage supply provided to inverter 500 is lower than Vh while the low voltage supply provided to inverter 502 is VSS, or higher than Vn if Vn is a negative voltage. The output of the level shifter circuit (an enabling signal) BD_out drives the gate terminals of all the n-channel pass transistors 520 of wordline drivers 410. The substrate terminal of all the pass transistors 520 are connected to Vn. Each pass transistor can selectively pass the source select (SS), wordline (S0-Sn) and ground select (GS) signals to the memory array. Placeholder "n" can be any non-zero integer number, typically corresponding to the maximum number of cells in the Flash cell string. The general operation of the block decoder circuit is now described.

In a program operation for example, one memory block is selected while other blocks remain unselected. In other words, one memory block can be enabled while remaining memory blocks are disabled. To enable a memory block, LTCH_EN and BA will be at the high logic level, thereby setting the level shifter circuit to output high voltage Vh. Therefore, all the pass transistors 520 of wordline driver circuit 410 are turned on. The wordline signals S0 to Sn and signals SS and GS will be driven to different voltage levels in accordance with the previously described source side asymmetrical precharge programming scheme embodiments. Disabled memory blocks will have their corresponding block decoder circuit output set to output low voltage Vn. Therefore, all the pass transistors 520 in the unselected memory blocks will be turned off.

FIG. 19 is a circuit schematic showing one row decoder circuit of row decoder 408 of FIG. 17. The presently shown schematic of FIG. 19 is a functional representation only, as there can be different specific circuit implementations that are possible. FIG. 19 shows one circuit for generating one row signal Si where i can be an integer value between 0 and n, but the circuits for generating signals SS and GS are similarly configured. The row decoder circuit includes a multiplexor 600 for receiving all the voltages that are used during program, program verify, read, erase and erase verify operations. To simplify the schematic of FIG. 19, multiplexor 600 is configured to show only the voltages used for the source side asymmetrical precharge programming scheme embodiments. This includes for example programming voltage V1 (Vpgm), pass voltage Vpass (V2), reduced pass voltage Vdcp (V3), VDD and VSS. Although not shown, the row decoder for providing GSL will have a multiplexor that receives in addition to other voltages, voltage V5. Similarly, the row decoder for providing SSL will have a multiplexor that receives in addition to other voltages, supply voltage VDD.

Any number of voltages can be provided to multiplexor 600, and then selectively passed to node Sn. Voltage selection signal Vselect is used to pass any one of the voltages. Those skilled in the art will understand that Vselect will be a multi-bit signal, the number depending on the number of input ports that multiplexor 600 is configured to have. An n-channel disabling transistor 602 couples Si to VSS when RA_b is at the high logic level, when the block is unselected. In the programming operation, disabling transistor is turned off and Vselect is controlled by control logic, such as the command decoder, to couple the necessary voltage to Si. In one embodiment, there is one Vselect signal for each row decoder circuit 408 of the block. Thus, one Vselect signal for row S1 in one block can be used for row position S1 in other blocks.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

In the embodiments described above, the device elements are connected to each other as shown in the figures, for the sake of simplicity. In practical applications of the present invention to an apparatus, devices, elements, circuits, etc. may be connected directly to each other. As well, devices, elements, circuits etc. may be connected indirectly to each other through other devices, elements, circuits, etc., necessary for operation of the apparatus. Thus, in actual configuration, the circuit elements and devices are directly or indirectly coupled with, or connected to, each other.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method for programming a NAND flash string having a source line select device, memory cells and a string select device connected in series between a bitline and a source line comprising:
    driving all wordlines to a first pass voltage for coupling a string precharge voltage provided by the source line to the memory cells, the string precharge voltage being greater than the first pass voltage;
    continuing driving all the wordlines except a first wordline corresponding to a first memory cell adjacent to a selected memory cell to a second pass voltage greater than the first pass voltage, the first memory cell being positioned between the selected memory cell and the string select device;
    driving a second wordline corresponding to a second memory cell adjacent to the selected memory cell to a first supply voltage for turning off the second memory cell;
    driving a third wordline corresponding to the selected memory cell to a programming voltage greater than the second pass voltage; and,
    coupling the bitline to the selected memory cell.

2. The method of claim 1, wherein coupling the string precharge voltage includes driving the source line select device to a source line pass voltage.

3. The method of claim 1, wherein coupling the bitline includes driving the string select device to the second supply voltage.

4. The method of claim 2, wherein the programming voltage is greater than the second pass voltage, the string precharge voltage and the source line pass voltage, the string precharge voltage is at least the source line pass voltage, and the first pass voltage is at least 0V.

5. The method of claim 4, wherein the string precharge voltage and the source line pass voltage are at the first pass voltage.

6. The method of claim 4, wherein the first pass voltage is greater than a programmed memory cell threshold voltage.

7. The method of claim 4, wherein the memory cells in advance of the selected memory cell in a sequential programming direction correspond to erased pages.

8. The method of claim 7, wherein the sequential programming direction includes a first direction being from the selected memory cell to the source line, and a second direction being from the selected memory cell to the bitline.

9. The method of claim 8, wherein the first pass voltage is set to 0V in the second programming direction.

* * * * *